(12) United States Patent
Tanaka et al.

(10) Patent No.: US 9,962,771 B2
(45) Date of Patent: May 8, 2018

(54) SURFACE-COATED TOOL AND METHOD OF MANUFACTURING THE SAME

(71) Applicant: SUMITOMO ELECTRIC HARDMETAL CORP., Itami-shi (JP)

(72) Inventors: Keizo Tanaka, Sorachi-gun (JP); Hiroki Takeshita, Sorachi-gun (JP); Kazuhiro Hirose, Sorachi-gun (JP); Haruyo Fukui, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 41 days.

(21) Appl. No.: 14/909,559

(22) PCT Filed: May 19, 2015

(86) PCT No.: PCT/JP2015/064293
§ 371 (c)(1),
(2) Date: Feb. 2, 2016

(87) PCT Pub. No.: WO2015/186503
PCT Pub. Date: Dec. 10, 2015

(65) Prior Publication Data
US 2016/0175939 A1  Jun. 23, 2016

(30) Foreign Application Priority Data

Jun. 6, 2014 (JP) ................................. 2014-117679
Jun. 6, 2014 (JP) ................................. 2014-117680

(51) Int. Cl.
*B23B 27/14* (2006.01)
*B23B 51/00* (2006.01)
(Continued)

(52) U.S. Cl.
CPC ............ *B23B 27/148* (2013.01); *B23B 51/00* (2013.01); *B23C 5/16* (2013.01); *C23C 14/022* (2013.01);
(Continued)

(58) Field of Classification Search
USPC .......... 51/307, 309; 428/216, 325, 336, 697, 428/698, 699; 427/419
See application file for complete search history.

(56) References Cited

U.S. PATENT DOCUMENTS 4,101,703 A * 7/1978 Schintlmeister ........ C23C 16/30
428/698
4,237,184 A * 12/1980 Gonseth ................ B23B 27/148
428/336
(Continued)

FOREIGN PATENT DOCUMENTS

CN          1876368 A      12/2006
CN          100589906 C     2/2010
(Continued)

OTHER PUBLICATIONS

International Search Report in PCT International Application No. PCT/JP2015/064293, dated Aug. 4, 2015.
(Continued)

*Primary Examiner* — Archene Turner
(74) *Attorney, Agent, or Firm* — Venable LLP; Michael A. Sartori; Laura G. Remus

(57) ABSTRACT

A surface-coated tool includes a substrate and a coating film formed on the substrate. The coating film includes an alternate layer in which one or more A layers and one or more B layers are alternately stacked. The A layer and the B layer each have a thickness not smaller than 2 nm and not greater than 100 nm. An average composition of the A layer is expressed as $Ti_aAl_bSi_cN$ ($0.5<a<0.8$, $0.2<b<0.4$,
(Continued)

$0.01<c<0.1$, $a+b+c=1$), an average composition of the B layer is expressed as $Ti_dAl_eSi_fN$ ($0.4<d<0.6$, $0.3<e<0.7$, $0.01<f<0.1$, $d+e+f=1$), and a condition of $0.05<A-D\leq0.2$ AND $0.05<E-B\leq0.2$ is satisfied.

13 Claims, 10 Drawing Sheets

(51) Int. Cl.
*B23C 5/16* (2006.01)
*C23C 14/06* (2006.01)
*C23C 14/02* (2006.01)
*C23C 14/32* (2006.01)
*C23C 28/04* (2006.01)
*C23C 28/00* (2006.01)

(52) U.S. Cl.
CPC ............ *C23C 14/024* (2013.01); *C23C 14/06* (2013.01); *C23C 14/0641* (2013.01); *C23C 14/325* (2013.01); *C23C 28/042* (2013.01); *C23C 28/044* (2013.01); *C23C 28/42* (2013.01); *B23B 2224/00* (2013.01); *B23B 2228/105* (2013.01); *B23C 2224/00* (2013.01); *B23C 2228/10* (2013.01)

(56) References Cited

U.S. PATENT DOCUMENTS

| | | |
|---|---|---|
| 5,580,653 A | 12/1996 | Tanaka et al. |
| 6,207,102 B1 * | 3/2001 | Rohlin .................. B22F 3/1028 427/249.17 |
| 6,267,797 B1 * | 7/2001 | Ostlund .................. C22C 1/051 75/240 |
| 6,326,093 B1 * | 12/2001 | Lindholm ............... C22C 29/08 428/698 |
| 6,342,291 B1 * | 1/2002 | Jonsson .................. C22C 29/08 51/307 |
| 7,169,485 B2 * | 1/2007 | Kohara ............... C23C 14/0641 428/336 |
| 7,727,621 B2 * | 6/2010 | Nordlof .................. C22C 29/08 428/698 |
| 2006/0269788 A1 | 11/2006 | Ishikawa |
| 2007/0269610 A1 | 11/2007 | Fukui et al. |
| 2008/0299366 A1 * | 12/2008 | Ahlgren .................. C22C 29/08 428/216 |
| 2013/0065081 A1 | 3/2013 | Ni et al. |

FOREIGN PATENT DOCUMENTS

| | | |
|---|---|---|
| JP | 07-310174 A | 11/1995 |
| JP | 08-127862 A | 5/1996 |
| JP | 2004-223619 A | 8/2004 |
| JP | 2007-002332 A | 1/2007 |
| JP | 2007-031779 A | 2/2007 |
| JP | 2010-018861 A | 1/2010 |
| JP | 5109199 B2 | 12/2012 |
| WO | WO-2006/070730 A1 | 7/2006 |

OTHER PUBLICATIONS

Notification of the First Office Action in counterpart Chinese Patent Application No. 201580001606.X, dated Oct. 9, 2016.

* cited by examiner

SURFACE-COATED TOOL AND METHOD OF MANUFACTURING THE SAME

TECHNICAL FIELD

The present invention relates to a surface-coated tool and a method of manufacturing the same.

BACKGROUND ART

A cutting tool (a surface-coated tool) of which various characteristics represented by wear resistance have been improved by forming a coating film on a surface of a substrate has been known [see, for example, Japanese Patent Laying-Open No. 7-310174 (PTD 1), International Publication WO2006/070730 (PTD 2), Japanese Patent Laying-Open No. 8-127862 (PTD 3), and Japanese Patent Laying-Open No. 2007-31779 (PTD 4)].

CITATION LIST

Patent Document

PTD 1: Japanese Patent Laying-Open No. 7-310174
PTD 2: International Publication WO2006/070730
PTD 3: Japanese Patent Laying-Open No. 8-127862
PTD 4: Japanese Patent Laying-Open No. 2007-31779

SUMMARY OF INVENTION

Technical Problem

What is called a "difficult-to-cut material" such as stainless steel, Inconel®, or a titanium alloy has recently widely been used in industrial products. Since the difficult-to-cut material is a material excellent in mechanical and thermal properties, a range of applications is expected to expand also in the future. Such a difficult-to-cut material, however, is a material which is literally difficult to cut. In general, the difficult-to-cut material is low in thermal conductivity, and in addition, it is also high in reactivity (affinity) with a cutting tool. Therefore, in cutting of a difficult-to-cut material, wear of a cutting tool is accelerated by increase in temperature of the tool and the difficult-to-cut material adheres to a cutting edge of the tool, which may lead to adhesion fracture.

In order to achieve longer life of a cutting tool in working of a difficult-to-cut material, various proposals have conventionally been made. For example, PTD 1 has proposed a coating film composed of a nitride or a carbonitride in which Si has been added to TiAlN representing a widely known composition of a coating film. This coating film, however, has a single composition, and therefore crystal grains tend to be coarse. When a crack is generated in the coating film, the crack rapidly develops along a crystal grain boundary, which may lead to fracture.

In contrast, PTD 2 has proposed a coating film including an alternate layer in which an AlCrN layer containing Cr and a TiAlN layer are alternately stacked. According to PTD 2, unit layers composed of materials different in type from each other instead of having a single composition are alternately stacked and each unit layer has a thickness not smaller than 0.005 µm and not greater than 2 µm, so that propagation of a crack can be suppressed. Such an alternate layer, however, also has a room for improvement. Namely, since the unit layers adjacent to each other in the alternate layer are composed of materials different in type from each other, dislocations tend to be accumulated around a boundary between the unit layers and delamination may occur during cutting.

In view of the problems above, it is a first object to provide a surface-coated tool exhibiting stable long life.

According to the techniques disclosed in PTDs 1 and 2, adhesiveness between a substrate and a coating film is not sufficient. Therefore, for example, when a material high in affinity with a material for a tool, such as stainless steel, is cut, what is called adhesion fracture in which a work material adheres to a cutting edge of the tool and the coating film peels off from the substrate occurs and life of the tool may become short.

In connection with adhesiveness between the substrate and the coating film, PTD 3 has proposed provision of an intermediate layer having lattices continuing to the coating film, between the substrate and the coating film. According to this technique, good adhesiveness is kept between the coating film and the intermediate layer. Adhesiveness between the substrate and the intermediate layer, however, is not necessarily sufficient, and there is a room for improvement in this regard.

In order to improve adhesiveness between the substrate and the coating film, PTD 4 has proposed formation of a projecting binder phase which forms a substantially triangular shape of which average height H is within a range of 0.05 µm<H<0.50 µm on a surface of a substrate (a sintered alloy). A ratio occupied by the binder phase in the sintered alloy, however, remains at most around 10%. Therefore, even though the entire binder phase exposed at the surface of the substrate could be bonded to the coating film, an adhesive action thereby is limited. In addition, in a case that a substrate is made of a composite material such as WC—Co based cemented carbide, many different materials are present as being mixed at an interface where the coating film and the substrate are in contact with each other, and it has not been easy to achieve ideal intimate contact of all of them.

As set forth above, according to the conventional techniques, adhesiveness between the substrate and the coating film has not been sufficient and life of a tool has been short, for example, under a severe cutting condition in which a difficult-to-cut material such as stainless steel or Inconel is adopted as a work material.

In view of such circumstances, it is a second object to provide a surface-coated tool which is excellent in adhesiveness between a substrate and a coating film and can withstand also a severe cutting condition.

Solution to Problem

A surface-coated tool according to one embodiment of the present invention includes a substrate and a coating film formed on the substrate, the coating film includes an alternate layer in which one or more A layers and one or more B layers are alternately stacked, the A layer and the B layer each have a thickness not smaller than 2 nm and not greater than 100 nm, an average composition of the A layer is expressed as $Ti_aAl_bSi_cN$ ($0.5<a<0.8$, $0.2<b<0.4$, $0.01<c<0.1$, $a+b+c=1$), an average composition of the B layer is expressed as $Ti_dAl_eSi_fN$ ($0.4<d<0.6$, $0.3<e<0.7$, $0.01<f<0.1$, $d+e+f=1$), and a condition of $0.05<a-d\leq0.2$ and $0.05<e-b\leq0.2$ is satisfied.

A surface-coated tool according to one embodiment of the present invention includes a substrate and a coating film formed on the substrate, the substrate contains WC particles and a binder phase containing Co and binding the WC particles to one another, the coating film includes an adhesive layer in contact with the substrate and an upper layer formed on the adhesive layer, the adhesive layer has a thickness not smaller than 0.5 nm and not greater than 20 nm, and the adhesive layer contains a carbide, a nitride, or a carbonitride containing one or more elements selected from Cr, Ti, Zr, and Nb, one or more elements selected from elements forming the substrate, and one or more elements selected from elements forming the upper layer.

A method of manufacturing a surface-coated tool according to one embodiment of the present invention includes the steps of preparing a substrate containing WC particles and a binder phase containing Co and binding the WC particles to one another and forming a coating film on the substrate, the step of forming a coating film includes the steps of adhering one or more elements selected from Cr, Ti, Zr, and Nb onto a surface of the substrate, forming an adhesive layer on the substrate, and forming an upper layer on the adhesive layer, the adhesive layer has a thickness not smaller than 0.5 nm and not greater than 20 nm, and the step of forming an adhesive layer includes the step of generating, by depositing one or more elements selected from elements forming the upper layer on the surface subjected to the adhering step, a carbide, a nitride, or a carbonitride containing one or more elements selected from Cr, Ti, Zr, and Nb, one or more elements selected from elements forming the substrate, and the one or more elements selected from the elements forming the upper layer.

Advantageous Effects of Invention

According to the above, a surface-coated tool exhibiting stable long life is provided.

DESCRIPTION OF EMBODIMENTS

Description of Embodiment of Present Invention

Figure 1:
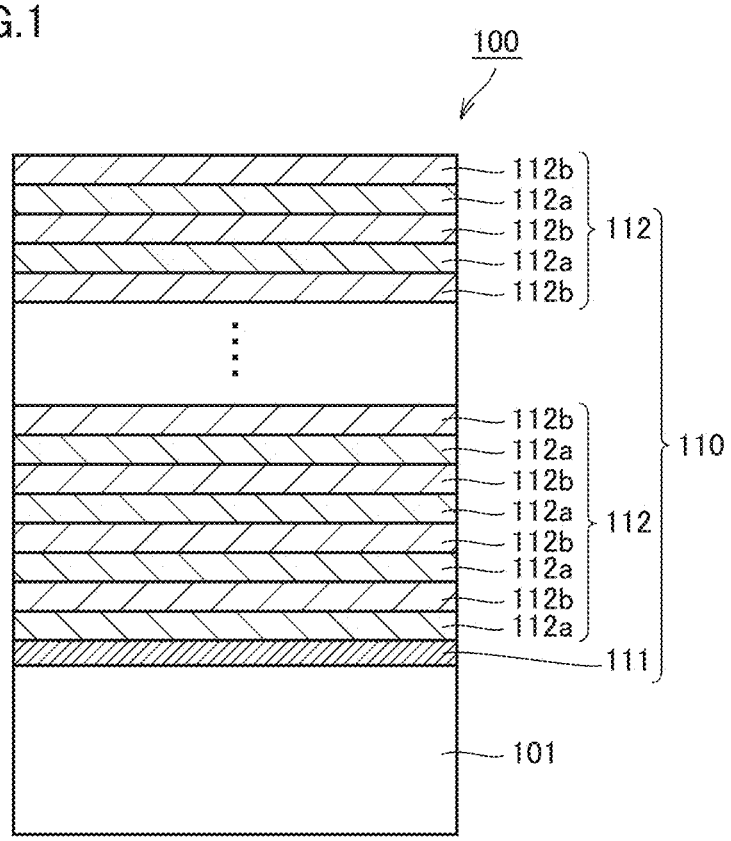
FIG. 1 is a schematic partial cross-sectional view showing one example of a construction of a surface-coated tool according to a first embodiment of the present invention.

Embodiments of the present invention will initially be listed and described. According to [1] to [4] below, the first object is mainly achieved. According to [5] to [13] below, the second object is mainly achieved.

[1] A surface-coated tool according to one embodiment of the present invention includes a substrate and a coating film formed on the substrate, the coating film includes an alternate layer in which one or more A layers and one or more B layers are alternately stacked, the A layer and the B layer each have a thickness not smaller than 2 nm and not greater than 100 nm, an average composition of the A layer is expressed as $Ti_aAl_bSi_cN$ (0.5<a<0.8, 0.2<b<0.4, 0.01<c<0.1, a+b+c=1), an average composition of the B layer is expressed as $Ti_dAl_eSi_fN$ (0.4<d<0.6, 0.3<e<0.7, 0.01<f<0.1, d+e+f=1), and a condition of 0.05<a−d≤0.2 and 0.05<e−b≤0.2 is satisfied.

Initially, in the surface-coated tool, such a composition that Ti (titanium) is more dominant than Al (aluminum) is adopted as an average composition of the entire alternate layer. Development of crater wear can thus be suppressed. Since the alternate layer contains a small amount of Si (silicon), it has also resistance to oxidation.

In addition, in the surface-coated tool, unlike the conventional techniques, an alternate layer in which one or more layers of each of two unit layers (the A layer and the B layer) which are intentionally close in composition to each other are alternately stacked is adopted. Since the A layer and the B layer are common in constituent elements and also close to each other in composition ratio as described above, the entire alternate layer is macroscopically observed as if it had a single composition. The average compositions of the A layer and the B layer, however, satisfy relation of 0.05<a−d≤0.2 and 0.05<e−b≤0.2. Therefore, between the A layer and the B layer, there is microscopically a boundary (a slight strain to such an extent as not leading to dislocation) across which the A layer and the B layer can be distinguished from each other as different layers. Consequently, though a coating film is as if it macroscopically had a single composition, propagation of a crack can be suppressed at the boundary between the A layer and the B layer when a crack is generated in the coating film. Since the A layer and the B layer are close to each other in average composition, crystal lattices can continue between the A layer and the B layer and adhesiveness between the A layer and the B layer can be ensured.

In addition, a thickness of each of the A layer and the B layer is restricted to be not smaller than 2 nm and not greater than 100 nm. Thus, crystal grains forming each A layer and each B layer are fine, an area of grain boundaries increases, and a function to stop plastic deformation and development of a crack at the grain boundaries is enhanced.

With combination of functions above, the surface-coated tool exhibits stable long life. Here, the "average composition" of the A layer and the B layer can be determined with transmission electron microscopy-energy dispersive X-ray spectrometry (TEM-EDX). Namely, the average composition can be determined by conducting TEM-EDX analysis on a spot diameter of 1 nm at any 5 points in the A layer or the B layer while a cross-section of the coating film is observed with the TEM and calculating an arithmetic mean value of composition ratios of each element obtained at the 5 points.

[2] In [1] above, preferably, a condition of $1 \leq \lambda_A/\lambda_B < 5$ is satisfied, where $\lambda_A$ represents the thickness of the A layer and $\lambda_B$ represents the thickness of the B layer. Resistance to crater wear of the alternate layer is improved and propagation of a crack can be stopped.

[3] In [1] or [2] above, preferably, the coating film further includes an adhesive layer in a portion in contact with the substrate, the adhesive layer has a thickness not smaller than 0.5 nm and not greater than 20 nm, and the adhesive layer contains a carbide, a nitride, or a carbonitride containing one or more elements selected from Cr, Ti, Zr, and Nb, one or more elements selected from elements forming the substrate, and one or more elements selected from Al and Si.

As the coating film includes the adhesive layer containing both of an element forming the substrate and an element forming the coating film and containing one or more elements selected from Cr (chromium), Ti, Zr (zirconium), and Nb (niobium), the substrate and the coating film are firmly bonded to each other and life of the tool is further longer.

The adhesive layer can be formed, for example, with a method as follows. Initially, by subjecting the surface of the substrate to ion bombardment treatment using ions of one or more elements selected from Cr, Ti, Zr, and Nb, a surface of the substrate is cleaned and the one or more elements selected from Cr, Ti, Zr, and Nb adhere to the surface of the substrate. Thereafter, an element forming the alternate layer (Ti, Al, Si, N) is vapor deposited on the surface with arc ion plating or the like. Thus, the adhesive layer can be formed as a lowermost layer (a layer closest to the substrate, of layers forming the coating film) of the coating film. By forming the adhesive layer with such a method, a coating film can be prevented from peeling off from a substrate in spite of the fact that the adhesive layer is an extremely thin layer having a thickness not smaller than 0.5 nm and not greater than 20 nm.

[4] In [3] above, preferably, the substrate contains hard particles containing WC and a binder phase containing Co and binding the hard particles to one another, and the adhesive layer contains a nitride containing W, Cr, Ti, Al, and Si.

As the substrate contains WC (tungsten carbide)-Co (cobalt) based cemented carbide as above, wear resistance of the tool is improved. Furthermore, here, when the adhesive layer contains a nitride containing W, Cr, Ti, Al, and Si, chemical affinity between the adhesive layer and both of the substrate and the alternate layer is enhanced and the substrate and the alternate layer can firmly be bonded to each other.

[5] A surface-coated tool according to one embodiment of the present invention includes a substrate and a coating film formed on the substrate, the substrate contains WC particles and a binder phase containing Co and binding the WC particles to one another, the coating film includes an adhesive layer in contact with the substrate and an upper layer formed on the adhesive layer, the adhesive layer has a thickness not smaller than 0.5 nm and not greater than 20 nm, and the adhesive layer contains a carbide, a nitride, or a carbonitride containing one or more elements selected from Cr, Ti, Zr, and Nb, one or more elements selected from elements forming the substrate, and one or more elements selected from elements forming the upper layer.

The surface-coated tool is excellent in adhesiveness between the substrate and the coating film and can exhibit stable long life even under a severe cutting condition. In the construction above, the upper layer is a layer formed mainly to enhance resistance to wear. The adhesive layer is formed at the interface between the substrate and the upper layer and contains both of the element forming the substrate and the element forming the upper layer. Therefore, the adhesive layer can exhibit chemical affinity with both of the substrate and the upper layer. Here, the adhesive layer further contains one or more elements selected from Cr, Ti, Zr, and Nb. Thus, in spite of the adhesive layer being extremely small in thickness not smaller than 0.5 nm and not greater than 20 nm, the adhesive layer can firmly bond the substrate and the upper layer to each other. Though a detailed mechanism exhibiting such a function is unclear, there may be an influence by the tendency that Cr, Ti, Zr, and Nb are likely to achieve strong bond to WC particles contained in a substrate.

[6] In [5] above, preferably, the upper layer contains one or more elements selected from group IV elements, group V elements, and group VI elements in the periodic table, and Si and Al and one or more elements selected from C, N, and O. As the upper layer contains these elements, wear resistance of the coating film is improved.

[7] In [5] or [6] above, preferably, the adhesive layer contains a carbonitride containing one or more elements selected from Cr, Ti, Zr, and Nb, W, and one or more elements selected from Al and Si.

As the adhesive layer is composed of a carbonitride containing these elements, adhesiveness between the substrate and the coating film is further improved.

[8] In [5] to [7] above, preferably, an occupancy by the WC particles in a portion of the substrate in contact with the adhesive layer is not lower than 80%.

By forming the adhesive layer on hard WC particles rather than on a soft binder phase, strength of adhesion between the substrate and the coating film is increased.

[9] In [5] to [8] above, preferably, in a direction of thickness of the coating film, a composition ratio of C contained in the adhesive layer continuously increases from a side of the upper layer toward the substrate and attains to the maximum at an interface with the substrate, and a composition ratio of N contained in the adhesive layer continuously increases from a side of the substrate toward the upper layer and attains to the maximum at an interface with the upper layer.

Thus, chemical affinity of the adhesive layer with the substrate and the upper layer is further enhanced, and adhesiveness is further improved.

[10] In [5] to [9] above, preferably, the WC particles have an average particle size not greater than 2 μm, and a content of Co in the substrate is not higher than 10 mass %.

When such a surface of the substrate is subjected, for example, to ion bombardment treatment which will be described later, the soft binder phase is removed and a grain boundary of the WC particles is exposed. When a coating film is formed thereon, what is called an anchor effect is obtained by fine projections and recesses originating from the grain boundary of the WC particles, and adhesiveness between the substrate and the coating film is improved.

[11] One embodiment of the present invention also relates to a method of manufacturing a surface-coated tool, and the manufacturing method includes the steps of preparing a substrate containing WC particles and a binder phase containing Co and binding the WC particles to one another and forming a coating film on the substrate, the step of forming a coating film includes the steps of adhering one or more elements selected from Cr, Ti, Zr, and Nb onto a surface of the substrate, forming an adhesive layer on the substrate, and forming an upper layer on the adhesive layer, the adhesive layer has a thickness not smaller than 0.5 nm and not greater than 20 nm, and the step of forming an adhesive layer includes the step of generating, by depositing one or more elements selected from elements forming the upper layer on the surface subjected to the adhering step, a carbide, a nitride, or a carbonitride containing one or more elements selected from Cr, Ti, Zr, and Nb, one or more elements selected from elements forming the substrate, and the one or more elements selected from the elements forming the upper layer.

Through these steps, a surface-coated tool which is excellent in adhesiveness between the substrate and the coating film and exhibits stable long life even under a severe cutting condition can be manufactured.

[12] In [11] above, preferably, the adhering step includes the step of cleaning the surface through ion bombardment treatment using ions of the one or more elements selected from Cr, Ti, Zr, and Nb.

Thus, one or more elements selected from Cr, Ti, Zr, and Nb can adhere to the surface of the substrate in a simplified manner, while the surface of the substrate is cleaned.

[13] In [11] or [12] above, preferably, the step of forming a coating film further includes, before the adhering step, removing at least a part of the binder phase exposed at the surface of the substrate through ion bombardment treatment using Ar ions.

By carrying out in advance ion bombardment treatment using Ar (argon) ions, the binder phase is removed from the surface. By thereafter carrying out ion bombardment treatment using ions of one or more elements selected from Cr, Ti, Zr, and Nb, these elements and the WC particles can firmly be bound to one another. Adhesiveness between the substrate and the coating film can thus be improved.

Details of Embodiments of Present Invention

Though an embodiment of the present invention (hereinafter also denoted as the "present embodiment") will be described hereinafter in detail, the present embodiment is not limited thereto. Though the description will be given below with reference to drawings, in the present specification and the drawings, the same or corresponding elements have the same reference characters allotted and the same description thereof will not be repeated.

First Embodiment

According to a first embodiment, the first object is mainly achieved.

<Surface-Coated Tool>

FIG. 1 is a schematic partial cross-sectional view showing one example of a construction of a surface-coated tool according to the present embodiment. Referring to FIG. 1, a surface-coated tool 100 includes a substrate 101 and a coating film 110 formed on substrate 101. Coating film 110 includes an alternate layer 112 in which one or more A layers 112a and one or more B layers 112b are alternately stacked. Coating film 110 further includes an adhesive layer 111 between alternate layer 112 and substrate 101.

Surface-coated tool 100 is typically a cutting tool. Surface-coated tool 100 may be, for example, a cutting tool such as a drill, an end mill, a throwaway tip for milling or turning, a metal saw, a gear cutting tool, a reamer, a tap, or a tip for pin milling of a crankshaft. Surface-coated tool 100 is not restricted to a cutting tool, and it is widely applicable, for example, to a tool or a part required to have wear resistance, such as a mold, a bearing, and a wear-resistant tool. Each element forming surface coated tool 100 will be described below.

<Substrate>

Substrate 101 is composed, for example, of cemented carbide, cermet, ceramics, a cubic boron nitride sintered object, or a diamond sintered object. Among these, cemented carbide is particularly preferred from a point of view of wear resistance and adhesiveness with the coating film. Namely, substrate 101 preferably contains hard particles containing WC and a binder phase containing Co and binding the hard particles to one another. So long as such a substrate made of WC—Co based cemented carbide contains WC and Co, it can contain any component other than these. For example, other than WC and Co, a carbonitride of Ti, Ta (tantalum), or Nb may be added, or an impurity inevitably introduced during manufacturing may be contained. Furthermore, free carbon or an abnormal layer called a "η layer" may be contained in a structure. A surface of substrate 101 may be reformed. For example, a beta (β) removal layer may be formed on the surface of substrate 101.

The hard particles (WC particles) in WC—Co based cemented carbide preferably have a particle size not smaller than 0.2 μm and not greater than 2 μm and a content of Co is preferably not lower than 4.0 mass % and not higher than 13.0 mass %. The binder phase (Co) is softer than the WC particles. Therefore, when the surface of substrate 101 is subjected to ion bombardment treatment which will be described later, the binder phase is removed and the WC particles are exposed at the surface. Here, when the particle size of the hard particles and the content of Co in a cemented carbide structure occupy the ranges above, fine projections and recesses originating from grain boundaries of the WC particles are formed in the surface of substrate 101. By forming coating film 110 on such a surface, adhesiveness between coating film 110 and substrate 101 can be improved by what is called an anchor effect. Here, a particle size of the hard particles is found by cutting the surface-coated tool and observing a cut surface with a scanning electron microscope (SEM) or a TEM similarly to a method of measuring a thickness of a coating film which will be described later. Here, a diameter of a circle circumscribing a hard particle (a diameter corresponding to a circumcircle) in an observation field of view is regarded as a diameter of the hard particle. Here, the hard particles have a particle size more preferably not greater than 1.5 μm. A content of Co is more preferably not higher than 11.0 mass % and particularly preferably not higher than 10.0 mass %.

<Coating Film>

Coating film 110 includes alternate layer 112 in which one or more A layers 112a and one or more B layers 112b are alternately stacked. Coating film 110 further includes adhesive layer 111 between alternate layer 112 and substrate 101. Here, coating film 110 should only be provided at least in a cutting edge portion, and it does not necessarily have to evenly cover the entire surface of substrate 101. Namely, an embodiment in which a coating film is not partially formed on substrate 101 or an embodiment in which a stack structure of a coating film is partially different is also encompassed in the present embodiment. Coating film 110 may also further include a layer other than alternate layer 112 and adhesive layer 111. For example, coating film 110 may also include a coloring layer composed of TiN as an outermost surface.

The total thickness of coating film 110 is preferably not smaller than 0.5 μm and not greater than 15 μm. When the thickness is smaller than 0.5 μm, the coating film is too small in thickness and life of the tool may be short. When the thickness exceeds 15 μm, chipping tends to occur in an early stage of cutting and life of the tool may be short. The total thickness of coating film 110 is more preferably not smaller than 0.5 μm and not greater than 10 μm and particularly preferably not smaller than 1.0 μm and not greater than 5.0 μm. A crystal grain forming coating film 110 is desirably cubic. When the entire coating film or a part thereof is amorphous, hardness of the coating film lowers and life of the tool may be short.

A thickness of the coating film and a thickness of each layer forming the coating film are herein measured by cutting a surface-coated tool and observing a cut surface with an SEM or a TEM. In observation, the cut surface is desirably subjected to surface treatment with a focused ion beam (FIB) apparatus or a cross section polisher (CP). Furthermore, an average composition of each layer can also be found by conducting TEM-EDX analysis at the cut surface with the use of an energy dispersive X-ray spectrometer associated with the TEM.

<Alternate Layer>

Alternate layer 112 is obtained by alternately stacking one or more A layers 112a and one or more B layers 112b. A layer 112a and B layer 112b are both composed of a nitride of Ti, Al, and Si, however, they are different from each other in composition ratio of at least Ti and Al. Thus, a slight strain is produced at a boundary between the A layer and the B layer and a function to stop propagation of a crack is exhibited. Furthermore, since A layer 112a and B layer 112b are common in constituent elements, adhesiveness between layers is also high.

So long as one or more A layers 112a and one or more B layers 112b are alternately stacked in alternate layer 112, the number of stacked layers (the total number of the A layers and the B layers) is not particularly restricted. The number of stacked layers is, for example, approximately from 10 to 10000, preferably approximately from 10 to 5000, and more preferably approximately from 20 to 500. So long as alternate layer 112 has such a stack structure, the outermost layer of alternate layer 112 may be any of A layer 112a and B layer 112b, and similarly, the lowermost layer of alternate layer 112 (a layer closest to the substrate, of layers forming the alternate layer) may be any of A layer 112a and B layer 112b.

Figure 2:
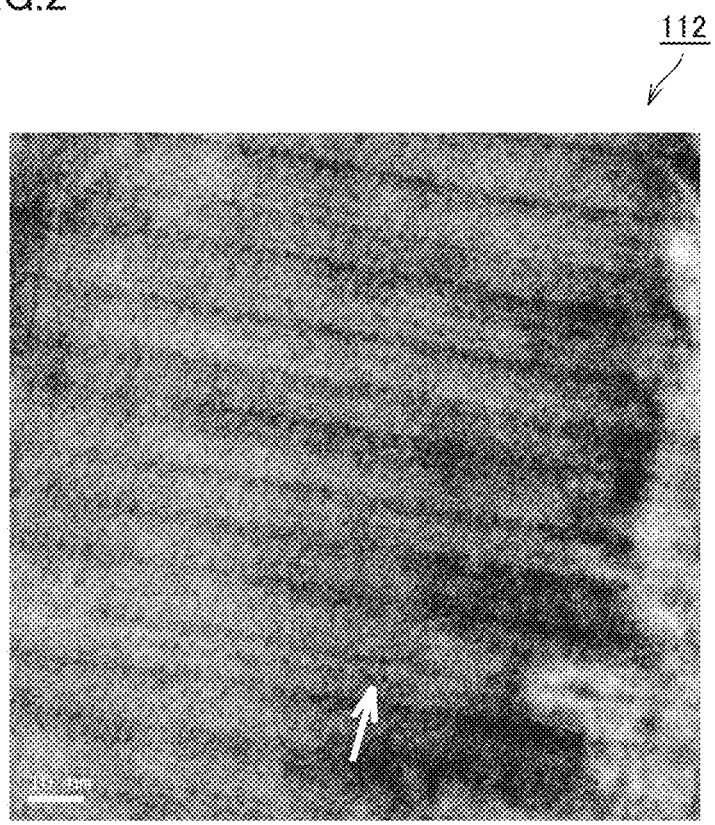
FIG. 2 shows a cross-sectional TEM image showing one example of an alternate layer according to the first embodiment of the present invention.

FIG. 2 shows a cross-sectional TEM image (at a magnification of 1200000) of alternate layer 112 in the present embodiment. FIG. 2 shows a dark-field image, where a portion higher in composition ratio of an element great in atomic weight (Ti in FIG. 2) is shown as being whiter. An arrow in FIG. 2 shows a direction of stack (a direction of thickness) of alternate layer 112. In FIG. 2, alternate stack of a portion higher in composition ratio of Ti (A layer) and a portion lower in composition ratio of Ti than the A layer (B layer) can be observed.

<A Layer>

An average composition of A layer 112a is expressed as $Ti_aAl_bSi_cN$ (0.5<a<0.8, 0.2<b<0.4, 0.01<c<0.1, a+b+c=1). The present embodiment is different in concept from the conventional techniques in adoption of such a composition that Ti is more dominant than Al. It has conventionally been considered that, in a TiAlN-based coating film, a higher composition ratio of Al can result in higher hardness and hence longer life of tool. As a result of detailed analysis of a form of damage of a cutting edge in cutting of a difficult-to-cut material (stainless steel or Inconel) by the present inventor, it has been found that, by increasing a composition ratio of Ti, resistance to crater wear is improved and life of the tool is longer to the contrary. Here, according to the studies conducted by the present inventor, more preferably, a composition ratio of Ti satisfies a condition of 0.55≤a≤0.65 and a composition ratio of Al satisfies a condition of 0.25≤b<0.40, because life of the tool is longer.

In addition, in the present embodiment, a composition containing a small amount of Si is adopted. Resistance to oxidation can thus be provided to the coating film. The composition ratio of Si is restricted to less than 0.1, because a strain of crystal lattices is great when the composition ratio of Si is 0.1 or higher, and consequently residual stress is higher and adhesiveness between A layer 112a and B layer 112b is lowered. Furthermore, when the composition ratio of Si is 0.1 or higher, amorphous $SiN_x$ is generated in coating film 110 and hardness may lower.

<B Layer>

An average composition of B layer 112b is expressed as $Ti_dAl_eSi_fN$ (0.4<d<0.6, 0.3<e<0.7, 0.01<f<0.1, d+e+f=1). As A layer 112a and B layer 112b are composed of the same elements, chemical affinity therebetween is enhanced and adhesiveness therebetween is ensured. Furthermore, in the present embodiment, relation of 0.05<a−d≤0.2 and 0.05<e−b≤0.2 is satisfied between the composition of the B layer and the composition of A layer 112a. By providing such a difference, a strain to such an extent as not leading to dislocation (defect) is produced at the boundary between A layer 112a and B layer 112b, and propagation of a crack can be stopped. When "a−d" and "e−b" are not greater than 0.05, A layer 112a and B layer 112b are too close to each other in composition and propagation of a crack cannot be suppressed as in the coating film having the conventional single composition. On the other hand, when "a−d" and "e−b" exceed 0.2, compositions are too different from each other, which will lead to lowering in adhesiveness between A layer 112a and B layer 112b. According to the studies conducted by the present inventor, "a−d" and "e−b" more preferably satisfy relation of 0.05<a−d≤0.1 and 0.05<e−b≤0.1, because a function to suppress propagation of a crack and adhesiveness between layers are further improved.

An average composition of each of A layer 112a and B layer 112b can be determined through TEM-EDX analysis described previously. Here, so long as the relation above (a ratio of element composition) is satisfied, an average composition of each of the plurality of A layers 112a may be different, and all A layers are not necessarily the same in composition. The same function is obtained even though the composition is different. This is also the case with B layer 112b.

So long as the average compositions of A layer 112a and B layer 112b satisfy the relation above, a composition ratio of each element may also vary continuously or stepwise in the direction of thickness of the coating film, in each A layer 112a and each B layer 112b. In particular, a composition ratio "a" of Ti in A layer 112a and a composition ratio "d" of Ti in B layer 112b may vary continuously or stepwise in the direction of thickness of the coating film. By continuously changing "a" and "d", adhesiveness between A layer 112a and B layer 112b can be enhanced. By changing "a" and "d" stepwise, a function to stop development of a crack in alternate layer 112 can be enhanced. Therefore, in any case, life of the tool can be longer.

<Thickness of A Layer and B Layer>

A thickness of each of A layer 112a and B layer 112b is not smaller than 2 nm and not greater than 100 nm. When the thickness is smaller than 2 nm, adjacent A layer and B layer are mixed with each other and a function to stop propagation of a crack between the A layer and the B layer is weakened. When the thickness is greater than 100 nm, adhesiveness between the A layer and the B layer is lowered. When each layer has a thickness not smaller than 2 nm and not greater than 100 nm, propagation of a crack generated in the surface of coating film 110 can be suppressed and adhesiveness between layers can be enhanced. Each layer has a thickness more preferably not smaller than 2 nm and not greater than 80 nm, further preferably not smaller than 2 nm and not greater than 50 nm, particularly preferably not smaller than 2 nm and not greater than 30 nm, and most preferably not smaller than 5 nm and not greater than 20 nm. By restricting a thickness of each layer to the range above, crystal grains are fine, an area of grain boundaries increases, and a function to stop plastic deformation and development of a crack at the grain boundaries is enhanced.

In alternate layer 112, A layers 112a may be different from one another or all be substantially the same in thickness. Similarly, in alternate layer 112, B layers 112b may be different from one another or all be substantially the same in thickness.

Here, "$\lambda_A/\lambda_B$" representing a ratio of thickness between A layer 112a and B layer 112b preferably satisfies a condition of $1 \leq \lambda_A/\lambda_B < 5$, where "$\lambda_A$" represents a thickness of A layer 112a and "$\lambda_B$" represents a thickness of B layer 112b. Thus, resistance to crater wear of alternate layer 112 is improved and propagation of a crack can efficiently be suppressed. "$\lambda_A/\lambda_B$" more preferably satisfies a condition of $1 \leq \lambda_A/\lambda_B \leq 2$, because such a function is further enhanced.

A composition ratio of Ti in the entire alternate layer 112 is preferably not lower than 0.5 and not greater than 0.7 and more preferably not lower than 0.55 and not higher than 0.65. As the composition ratio of Ti in the entire alternate layer 112 exceeds 0.5, resistance to crater wear is improved. Here, a composition ratio of Ti in the entire alternate layer 112 is calculated based on an expression below:

(Composition Ratio of Ti in Entire Alternate Layer)= $(a \times \lambda_A + d \times \lambda_B)/(\lambda_A + \lambda_B)$.

From a similar point of view, a composition ratio of Al in the entire alternate layer 112 is preferably not lower than 0.25 and lower than 0.5 and more preferably not lower than 0.30 and not higher than 0.40. Here, a composition ratio of Al in the entire alternate layer 112 is calculated based on an expression below:

(Composition Ratio of Al in Entire Alternate layer)= $(b \times \lambda_A + e \times \lambda_B)/(\lambda_A + \lambda_B)$.

<Adhesive Layer>

Coating film 110 can further include adhesive layer 111 in a portion in contact with substrate 101. As coating film 110 includes adhesive layer 111, peel-off of coating film 110 is prevented and life of the tool is further stabilized. Adhesive layer 111 desirably has chemical affinity with both of alternate layer 112 and substrate 101. Therefore, adhesive layer 111 is desirably composed of a carbide, a nitride, or a carbonitride containing an element forming substrate 101 (in the case of cemented carbide, W and/or C) and an element forming alternate layer 112 (Al, Si, and/or N). Furthermore, it has been found in experiments conducted by the present inventor that adhesiveness is noticeably improved as such a carbide, a nitride, or a carbonitride contains one or more elements selected from Cr, Ti, Zr, and Nb.

Here, it can also be confirmed that adhesive layer 111 contains these elements, through TEM-EDX analysis in accordance with the same procedure in finding an average composition of A layer 112a and B layer 112b described previously. Results of analysis conducted by the present inventor suggest that, when adhesive layer 111 having such a composition is formed, crystal lattices are continuous at each of an interface between alternate layer 112 and adhesive layer 111 and at an interface between adhesive layer 111 and substrate 101 and adhesiveness is improved thereby, which will be described in detail in a second embodiment which will be described later.

Specific examples of a carbide, a nitride, or a carbonitride forming adhesive layer 111 can include [a] to [j] as follows. Adhesive layer 111 can contain one or more of these compounds.

[a] a carbide, a nitride, or a carbonitride containing Ti and W (for example, WTiC, WTiN, or WTiCN)

[b] a carbide, a nitride, or a carbonitride containing Cr and W (for example, WCrC, WCrN, or WCrCN)

[c] a carbide, a nitride, or a carbonitride containing Ti, Cr, and W (for example, WCrTiC, WCrTiN, or WCrTiCN)

[d] a carbide, a nitride, or a carbonitride containing Ti, Al, and W (for example, WTiAlC, WTiAlN, or WTiAlCN)

[e] a carbide, a nitride, or a carbonitride containing Ti, Si, and W (for example, WTiSiC, WTiSiN, or WTiSiCN)

[f] a carbide, a nitride, or a carbonitride containing Ti, Cr, Al, and W (for example, WCrTiAlC, WCrTiAlN, or WCrTiAlCN)

[g] a carbide, a nitride, or a carbonitride containing Ti, Cr, Si, and W (for example, WCrTiSiC, WCrTiSiN, or WCrTiSiCN)

[h] a carbide, a nitride, or a carbonitride containing Ti, Al, Si, and W (for example, WTiAlSiC, WTiAlSiN, or WTiAlSiCN)

[i] a carbide, a nitride, or a carbonitride containing Ti, Cr, Al, Si, and W (for example, WCrTiAlSiC, WCrTiAlSiN, or WCrTiAlSiCN)

[j] a substance obtained by substituting the entirety or a part of Cr in [a] to [i] above with one or more elements selected from Ti, Zr, and Nb When a compound is herein expressed with a chemical formula as above and when an atomic ratio is not particularly limited, all atomic ratios that have conventionally been known are encompassed and the atomic ratio is not necessarily limited only to those in a stoichiometric range. For example, when the compound is denoted as "WTiCN", the atomic ratio among "W", "Ti", "C", and "N" is not limited to 25:25:25:25 and all atomic ratios that have conventionally been known are encompassed as the atomic ratio.

Adhesive layer 111 has a thickness preferably not smaller than 0.5 nm and not greater than 20 nm. When the thickness is smaller than 0.5 nm, a desired adhesive function may not be obtained. When the thickness exceeds 20 nm, residual stress in adhesive layer 111 may become high and peel-off may be likely to the contrary. Adhesive layer 111 has a thickness more preferably not smaller than 0.5 nm and not greater than 10 nm and particularly preferably not smaller than 2 nm and not greater than 6 nm.

<Non-Metallic Composition of Adhesive Layer>

When substrate 101 is composed of cemented carbide and adhesive layer 111 is composed of a carbonitride, in the direction of thickness of adhesive layer 111, desirably, a composition ratio of carbon (C) contained in adhesive layer 111 continuously increases from a side of alternate layer 112 toward substrate 101 and attains to the maximum at the interface with substrate 101 and a composition ratio of nitrogen (N) contained in adhesive layer 111 continuously increases from a side of substrate 101 toward alternate layer 112 and attains to the maximum at the interface with alternate layer 112. In the present embodiment, the cemented carbide contains a carbide (WC) and alternate layer 112 contains a nitride (TiAlSiN). Therefore, as the composition ratios of C and N vary as above in adhesive layer 111, chemical affinity with both of substrate 101 and alternate layer 112 is further improved. Such variation in composition ratio can be achieved, for example, by forming a film with a ratio of a flow rate between an N source gas and a C source gas being continuously varied in cathode arc ion plating which will be described later.

<Occupancy by Hard Particles at Interface Between Adhesive Layer and Substrate>

An occupancy by hard particles (WC particles) in a portion where adhesive layer 111 and substrate 101 are in contact with each other is preferably not lower than 80%. As there is less soft binder phase (Co or the like) at the interface between adhesive layer 111 and substrate 101, adhesive force between adhesive layer 111 and substrate 101 is higher. Here, the occupancy essentially refers to an occupancy of an area at the interface, however, it is defined herein in a cross-section of a surface-coated tool as follows. Namely, surface-coated tool 100 is cut along a plane including a normal to the surface thereof, a reference line having a length of 3 μm is set in the interface between adhesive layer 111 and substrate 101 in the obtained cut surface, a total length of a portion on the reference line where adhesive layer 111 and hard particles are in contact with each other is measured, and the total length is divided by the length (3 μm) of the reference line. A percentage of this value is defined as the occupancy by the WC particles. A higher occupancy is preferred and it is ideally 100%. Taking into account productivity, however, the upper limit value thereof is, for example, approximately 99%.

<Method of Manufacturing Surface-Coated Tool>

The surface-coated tool in the present embodiment described above can be manufactured with a method as follows. The manufacturing method includes the steps of preparing at least a substrate and forming a coating film.

<Step of Preparing Substrate>

In this step, substrate 101 is prepared. For example, a substrate made of cemented carbide is prepared as substrate 101. The substrate made of cemented carbide may be prepared with general powder metallurgy. WC—Co based cemented carbide (sintered object) is obtained, for example, by obtaining mixed powders by mixing WC powders and Co powders in a ball mill, followed by drying, obtaining a formed object by forming the dried mixed powders in a prescribed shape, and then sintering the formed object. Then, substrate 101 made of WC—Co based cemented carbide can be prepared by subjecting the sintered object to prescribed cutting edge working such as honing.

<Step of Forming Coating Film>

In order to allow coating film 110 to withstand also a high temperature during cutting of a difficult-to-cut material, coating film 110 is desirably composed of a compound high in crystallinity. As a result of review by the present inventor of various techniques for film formation in order to develop such a coating film, it has been found that physical vapor deposition is preferred. Physical vapor deposition refers to a vapor deposition method in which a source material (an evaporation source, also referred to as a target) is vaporized by making use of a physical action and the vaporized source material adheres onto a substrate. Such a physical vapor deposition method includes, for example, cathode arc ion plating, balanced magnetron sputtering, and unbalanced magnetron sputtering.

Here, "cathode arc ion plating" refers to a vapor deposition method, for example, in which a substrate and a target are arranged in a film formation apparatus and a high current is applied to the target to generate arc discharge, so that elements forming the target are ionized and deposited on the substrate to which a negative bias voltage is applied.

"Balanced magnetron sputtering" refers to a vapor deposition method in which a target is arranged on a magnetron electrode having a magnet forming balanced magnetic field, gas plasma is generated by applying high-frequency electric power across the substrate and the magnetron electrode, ions of the gas generated as a result of an action of the gas plasma collide with the target, and atoms released from the target are ionized and deposited on the substrate. "Unbalanced magnetron sputtering" refers to a vapor deposition method in which magnetic field generated by this magnetron electrode is not balanced.

<Step of Cleaning Surface of Substrate>

Among these physical vapor deposition methods, cathode arc ion plating is high in ratio of ionization of source materials and particularly suitable. By adopting cathode arc ion plating as a film formation method, the surface of substrate 101 can be subjected to ion bombardment treatment before coating film 110 is formed. Thus, a soft binder phase can be removed from the surface of substrate 101, and by thereafter forming adhesive layer 111, an occupancy by hard particles in a portion where adhesive layer 111 and substrate 101 are in contact with each other described previously can be enhanced.

<Step of Forming Adhesive Layer>

By using a target containing one or more elements selected from Cr, Ti, Zr, and Nb in the ion bombardment treatment, these elements can adhere to the surface of substrate 101 while the surface of substrate 101 is cleaned. By forming alternate layer 112 on the surface to which these elements have adhered, adhesive layer 111 excellent in adhesive capability can be formed. Here, elements used for ion bombardment treatment and contained in adhesive layer 111 desirably include at least Cr. Since Cr is a sublimable element, production of molten particles (droplets) is less during the ion bombardment treatment and the surface of substrate 101 can be prevented from roughening.

<Step of Forming Alternate Layer>

Various methods are available as the method of forming alternate layer 112 in which one or more A layers 112a and one or more B layers 112b are alternately stacked. For example, a method of using a target made of a sintered alloy in which Ti, Al, and Si are varied in particle size, a method of using a plurality of targets different in composition from one another, a method of setting a bias voltage to be applied during film formation to a pulse voltage or varying a flow rate of a gas, and a method of adjusting a period of rotation of a substrate holder for holding a substrate in a film formation apparatus are available. An alternate layer can also naturally be formed by combining these operations.

After alternate layer 112 is formed, compressive residual stress may be provided to coating film 110 for improving toughness of coating film 110. Compressive residual stress can be provided, for example, with blasting, brushing, barreling, and ion implantation.

Second Embodiment

According to a second embodiment, the second object is mainly achieved.

<Surface-Coated Tool>

Figure 5:
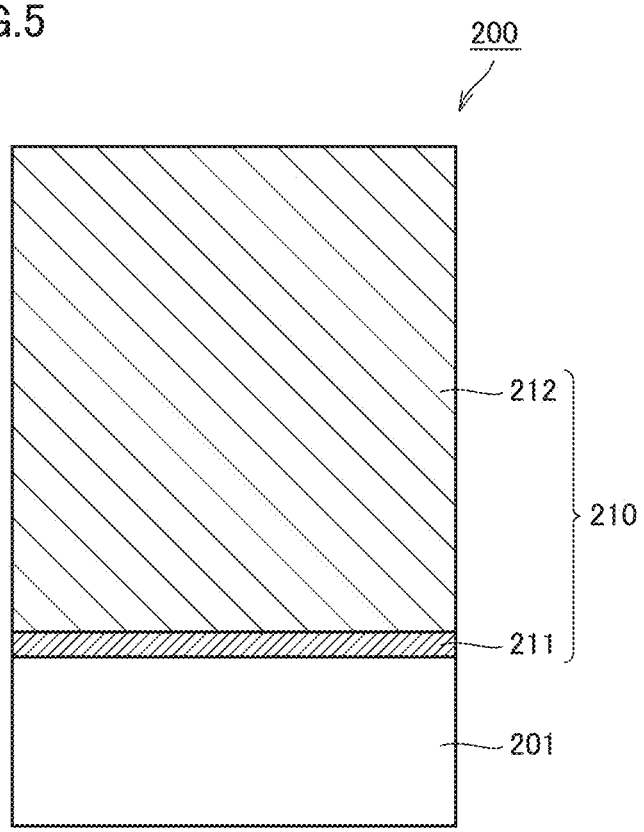
FIG. 5 is a schematic partial cross-sectional view showing one example of a construction of a surface-coated tool according to a second embodiment of the present invention.

FIG. 5 is a schematic partial cross-sectional view showing one example of a construction of a surface-coated tool according to the second embodiment. Referring to FIG. 5, a surface-coated tool 200 includes a substrate 201 and a coating film 210 formed on substrate 201. Coating film 210 includes an adhesive layer 211 in contact with substrate 201 and an upper layer 212 formed on adhesive layer 211.

Surface-coated tool 200 is typically a cutting tool. Surface-coated tool 200 may be, for example, a cutting tool such as a drill, an end mill, a throwaway tip for milling or turning, a metal saw, a gear cutting tool, a reamer, a tap, or a tip for pin milling of a crankshaft. Surface-coated tool 200 is not restricted to a cutting tool, and it is widely applicable, for example, to a tool or a part required to have wear resistance, such as a mold, a bearing, and a wear-resistant tool. Each element forming surface-coated tool 200 will be described below.

<Substrate>

Substrate 201 is composed of WC—Co based cemented carbide, and contains WC particles and a binder phase containing Co and binding the WC particles to one another. So long as substrate 201 contains these components, it can contain any component other than these. For example, other than the WC particles and Co, a carbonitride of Ti, Ta, or Nb may be added, or an impurity inevitably introduced during manufacturing may be contained. Furthermore, free carbon or an abnormal layer called a "η layer" may be contained in a structure. A surface of substrate 201 may be reformed. For example, a beta (β) removal layer may be formed on the surface of substrate 201.

The WC particles in substrate 201 preferably have a particle size not smaller than 0.2 µm and not greater than 2 µm and a content of Co is preferably not lower than 4.0 mass % and not higher than 13.0 mass %. The binder phase (Co) is softer than the WC particles. Therefore, when the surface of substrate 201 is subjected to ion bombardment treatment, the binder phase is removed and the WC particles are exposed at the surface. Here, when the particle size of the WC particles and the content of Co in a cemented carbide structure occupy the ranges above, fine projections and recesses originating from grain boundaries of the WC particles are formed in the surface of substrate 201. By forming coating film 210 on such a surface, adhesiveness between coating film 210 and substrate 201 can be improved by what is called an anchor effect. Here, the WC particles have a particle size more preferably not greater than 1.5 µm. A content of Co is more preferably not higher than 11.0 mass % and particularly preferably not higher than 10.0 mass %.

<Coating Film>

Coating film 210 includes adhesive layer 211 in contact with substrate 201 and upper layer 212 formed on adhesive layer 211. Coating film 210 should only be provided at least in a cutting edge portion, and it does not necessarily have to evenly cover the entire surface of substrate 201. Namely, an embodiment in which a coating film is not partially formed on substrate 201 or an embodiment in which a stack structure of a coating film is partially different is also encompassed in the present embodiment. Coating film 210 may also further include a layer other than adhesive layer 211 and upper layer 212. For example, coating film 210 may also include a coloring layer composed of TiN as an outermost surface.

The total thickness of coating film 210 is preferably not smaller than 0.5 µm and not greater than 15 µm. When the thickness is smaller than 0.5 µm, the coating film is too small in thickness and life of the tool may be short. When the thickness exceeds 15 µm, chipping tends to occur in an early stage of cutting and life of the tool may be short. The total thickness of coating film 210 is more preferably not smaller than 0.5 µm and not greater than 10 µm and particularly preferably not smaller than 1.0 µm and not greater than 5.0 µm. A crystal grain forming coating film 210 is desirably cubic. When the entire coating film or a part thereof is amorphous, hardness of the coating film lowers and life of the tool may be short.

<Upper Layer>

Upper layer 212 may be formed from a single layer or a stack of a plurality of layers. Upper layer 212 may include, in its entirety or in part, a modulation structure in which a composition of a compound forming the layer periodically varies in the direction of thickness or a super multi-layered structure in which two or more types of unit layers different in composition each having a thickness not smaller than 0.2 nm and not greater than 20 nm are periodically repeatedly stacked. Upper layer 212 may be an alternate layer described in the first embodiment.

A composition of each layer included in the coating film can be found through SEM-EDX analysis or TEM-EDX analysis.

Upper layer 212 preferably contains one or more elements selected from group IV elements [Ti, Zr, and Hf (hafnium)], group V elements [V (vanadium), Nb, and Ta], and group VI elements [Cr, Mo (molybdenum), and W] in the periodic table and Si and Al and one or more elements selected from C, N, and O (oxygen). Wear resistance of coating film 210 is thus improved.

Specific examples of the compound forming upper layer 212 can include TiCN, TiN, TiCNO, $TiO_2$, TiNO, TiSiN, TiSiCN, TiAlN, TiAlCrN, TiAlSiN, TiAlSiCrN, AlCrN, AlCrCN, AlCrVN, AlN, AlCN, $Al_2O_3$, ZrN, ZrCN, ZrN, $ZrO_2$, HOC, HfN, HfCN, NbC, NbCN, NbN, $Mo_2C$, WC, and $W_2C$. These compounds may further also be doped with a small amount of another element.

As described previously, for example, when denotation "TiCN" is given herein, an atomic ratio between "Ti", "C", and "N" is not limited to 50:25:25, and all atomic ratios that have conventionally been known are encompassed as the atomic ratio.

<Adhesive Layer>

Adhesive layer 211 is formed in a portion in contact with substrate 201. As surface-coated tool 200 includes adhesive layer 211, peel-off of coating film 210 is suppressed and life of the tool is extended as compared with a conventional example. Adhesive layer 211 has a thickness not smaller than 0.5 nm and not greater than 20 nm. When the thickness is smaller than 0.5 nm, a desired adhesive function may not be obtained. When the thickness exceeds 20 nm, residual stress in adhesive layer 211 may become high and peel-off may be likely to the contrary. Adhesive layer 211 has a thickness more preferably not smaller than 0.5 nm and not greater than 10 nm and particularly preferably not smaller than 2 nm and not greater than 6 nm.

Adhesive layer 211 contains a carbide, a nitride, or a carbonitride containing one or more elements selected from Cr, Ti, Zr, and Nb, one or more elements selected from elements (W and C) forming substrate 201, and one or more elements selected from elements (Al, Si, and N) forming upper layer 212. Since adhesive layer 211 contains constituent elements of substrate 201 and upper layer 212, it can exhibit high chemical affinity with both of substrate 201 and upper layer 212. Furthermore, one or more elements selected from Cr, Ti, Zr, and Nb achieve strong bond with carbon contained in the WC particles, so that resistance to peel-off is improved.

Figure 6:
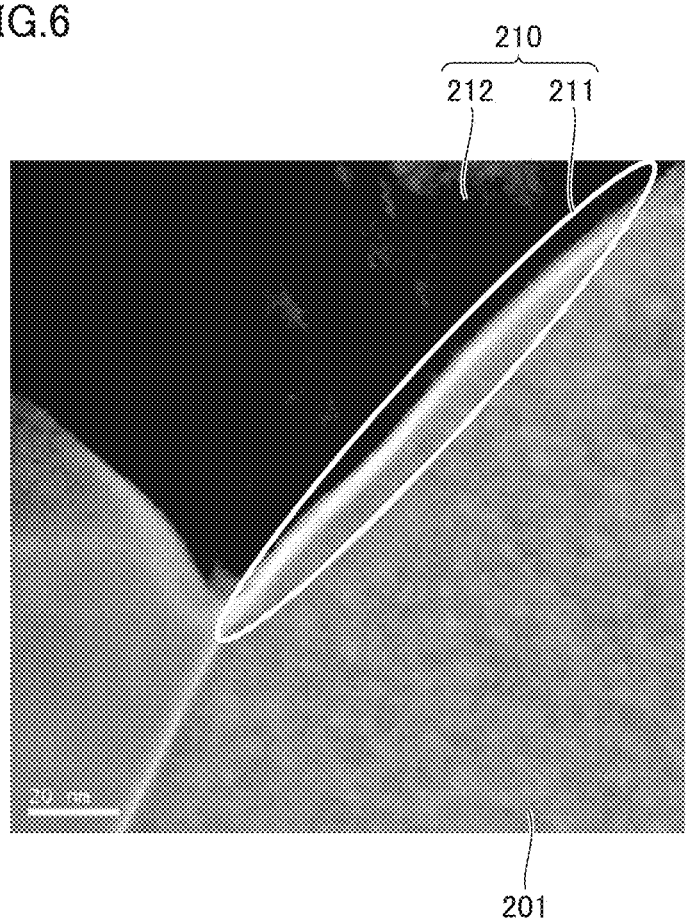
FIG. 6 shows a cross-sectional TEM image showing one example of an interface between a substrate and a coating film according to the second embodiment of the present invention.
Figure 7:
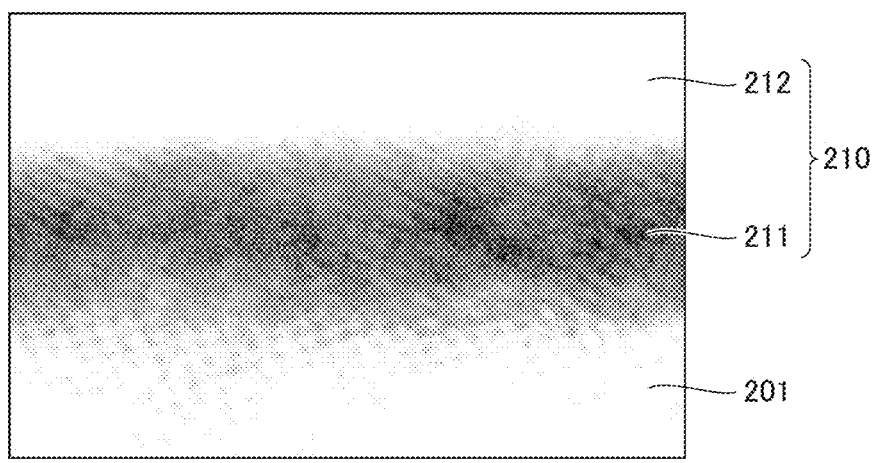
FIG. 7 is an enlarged view of an adhesive layer in FIG. 6.

Studies conducted by the present inventor suggest that, when an adhesive layer having such a composition is formed, crystal lattices are continuous at an interface between substrate 201 and adhesive layer 211 and at an interface between adhesive layer 211 and upper layer 212 and thus adhesiveness is improved. FIG. 6 shows a TEM image (at a magnification of 1000000) obtained by photographing the interface between substrate 201 and coating film 210 at a cut surface of surface-coated tool 200 in the present embodiment. It can be seen in FIG. 6 that adhesive layer 211 having a thickness not smaller than 0.5 nm and not greater than 20 nm is formed at the interface between substrate 201 (WC particles) and upper layer 212. FIG. 7 is a partial enlarged view of a portion associated with adhesive layer 211 in FIG. 6, with contrast being adjusted. It can be confirmed in FIG. 7 that crystal lattices are continuous at the interface between substrate 201 and adhesive layer 211 and also at the interface between adhesive layer 211 and upper layer 212. Thus, the present embodiment is considered to have improved adhesiveness as the crystal lattices are continuous at each interface.

Specific examples of a carbide, a nitride, or a carbonitride forming adhesive layer 211 can include the compounds [a] to [j] described previously in the first embodiment. Adhesive layer 211 can contain one or more of these compounds.

According to the studies conducted by the present inventor, it has been found that particularly high adhesiveness is exhibited by a carbonitride containing one or more elements selected from Cr, Ti, Zr, and Nb, W, and one or more elements selected from Al and Si, among these. Then, a composition of a compound forming adhesive layer 211 with one or more elements selected from Cr, Zr, and Nb being denoted as "M" is desirably expressed by an expression below:

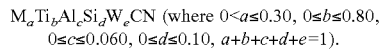

$M_a Ti_b Al_c Si_d W_e CN$ (where $0<a\le 0.30$, $0\le b\le 0.80$, $0\le c\le 0.060$, $0\le d\le 0.10$, $a+b+c+d+e=1$).

<Non-Metallic Composition of Adhesive Layer>

When upper layer 212 is composed of a nitride and adhesive layer 211 is composed of a carbonitride, in the direction of thickness of adhesive layer 211, desirably, a composition ratio of C contained in adhesive layer 211 continuously increases from a side of upper layer 212 toward substrate 201 and attains to the maximum at the interface with substrate 201 and a composition ratio of N contained in adhesive layer 211 continuously increases from a side of substrate 201 toward upper layer 212 and attains to the maximum at the interface with upper layer 212. Since substrate 201 contains a carbide (WC) and upper layer 212 contains a nitride (TiAlSiN), with change in composition ratio of C and N in adhesive layer 211 as above, chemical affinity with both of substrate 201 and upper layer 212 is further improved. Such variation in composition ratio can be achieved, for example, by forming a film with a ratio of a flow rate between an N source gas and a C source gas being continuously varied in cathode arc ion plating.

<Occupancy by WC Particles at Interface Between Adhesive Layer and Substrate>

An occupancy by the WC particles in a portion where adhesive layer 211 and substrate 201 are in contact with each other is preferably not lower than 80% and more preferably not lower than 90% As there is less soft binder phase (Co or the like) at the interface between adhesive layer 211 and substrate 201, adhesive force between adhesive layer 211 and substrate 201 is higher. Here, an occupancy is defined in a cross-section of a surface-coated tool as described in the first embodiment. A higher occupancy is preferred and it is ideally 100%. Taking into account productivity, however, the upper limit value thereof is, for example, approximately 99%.

<Method of Manufacturing Surface-Coated Tool>

Figure 10:
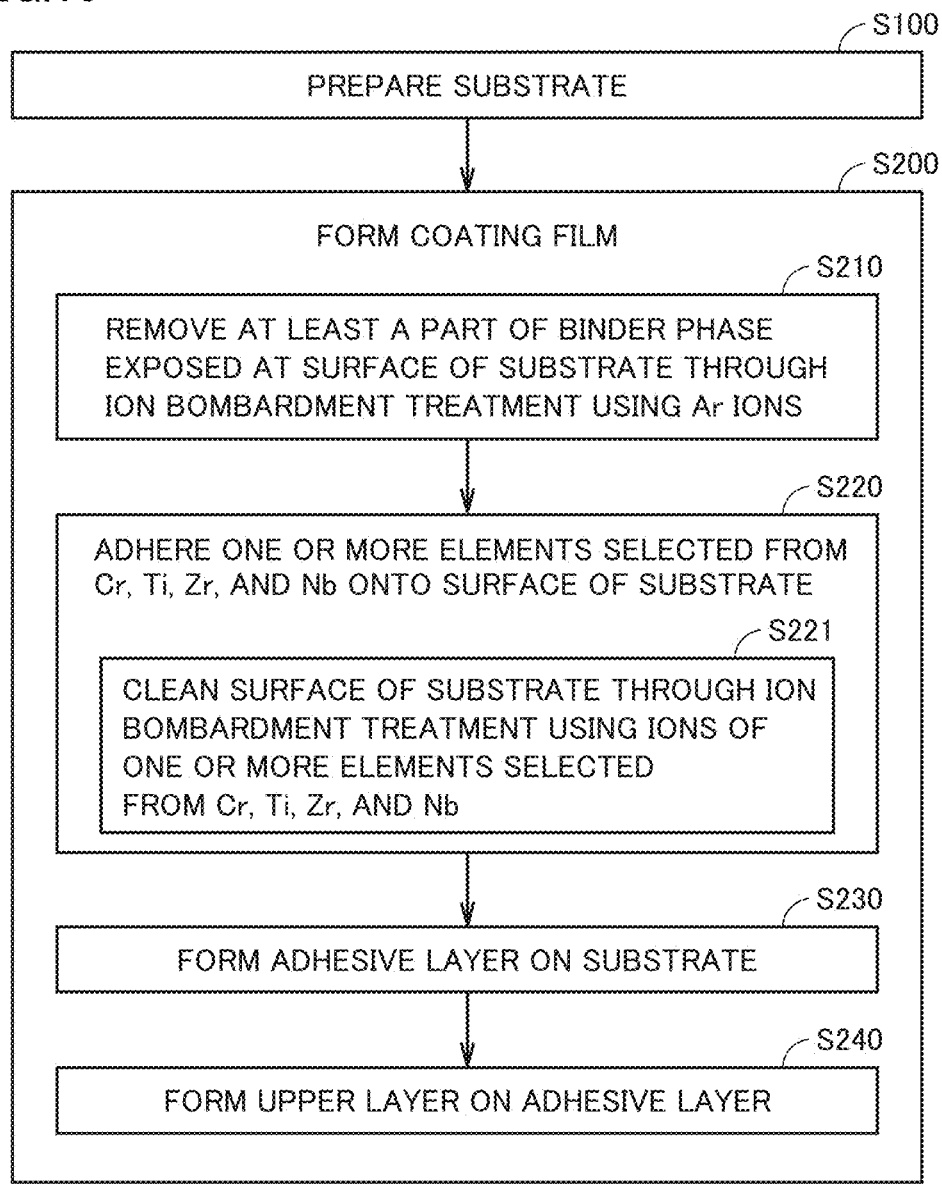
FIG. 10 is a flowchart showing overview of a method of manufacturing a surface-coated tool according to the second embodiment of the present invention.

The surface-coated tool in the present embodiment described above can be manufactured with a method as follows. FIG. 10 is a flowchart showing overview of a method of manufacturing a surface-coated tool according to the present embodiment. Referring to FIG. 10, the manufacturing method includes the steps of preparing a substrate (S100) and forming a coating film (S200). The step of forming a coating film (S200) includes the steps of adhering one or more elements selected from Cr, Ti, Zr, and Nb onto a surface of the substrate (S220), forming an adhesive layer (S230), and forming an upper layer (S240). Each step will be described below.

<Step of Preparing Substrate (S100)>

In this step, substrate 201 containing WC particles and a binder phase containing Co and binding the WC particles to one another is prepared. Such a substrate made of WC—Co based cemented carbide can be prepared with general powder metallurgy. WC—Co based cemented carbide (sintered object) is obtained, for example, by obtaining mixed powders by mixing WC powders and Co powders in a ball mill, followed by drying, obtaining a formed object by forming the dried mixed powders in a prescribed shape, and then sintering the formed object. Then, substrate 201 made of WC—Co based cemented carbide can be prepared by subjecting the sintered object to prescribed cutting edge working such as honing.

<Step of Forming Coating Film (S200)>

In order to allow coating film 210 to withstand also a high temperature during cutting of a difficult-to-cut material, coating film 210 is desirably composed of a compound high in crystallinity. As a result of review by the present inventor of various techniques for film formation in order to develop such a coating film, it has been found that physical vapor deposition is preferred. Physical vapor deposition refers to a vapor deposition method in which a source material (an evaporation source, also referred to as a target) is vaporized by making use of a physical action and the vaporized source material adheres onto a substrate. Such a physical vapor deposition method includes, for example, cathode arc ion plating, balanced magnetron sputtering, and unbalanced magnetron sputtering.

Among these physical vapor deposition methods, cathode arc ion plating is particularly suitable because it is high in ratio of ionization of source materials. By adopting cathode arc ion plating, the substrate can be cleaned through ion bombardment treatment in the same film formation apparatus, which can contribute to simplification of a manufacturing process and improvement in productivity.

<Step of Adhering Element onto Surface of Substrate (S220)>

In the present embodiment, before coating film 210 is formed, an element to form a part of adhesive layer 211 (one or more selected from Cr, Ti, Zr, and Nb) adheres to the surface of substrate 201. For example, the surface of substrate 201 is subjected to ion bombardment treatment with these elements being included in targets, so that the surface of substrate 201 can be cleaned and these elements can adhere to the surface of substrate 201. Namely, the adhering step (S220) can include the step of cleaning the surface of substrate 201 (S221) through ion bombardment treatment using ions of one or more elements selected from Cr, Ti, Zr, and Nb. Thus, the soft binder phase can be removed from the surface of substrate 201, an occupancy by the WC particles at the surface can be enhanced, and consequently, an occupancy by the WC particles in a portion where adhesive layer 211 and substrate 201 are in contact with each other described previously can be enhanced. The occupancy by the WC particles can be adjusted, for example, based on a time period for ion bombardment treatment.

Elements used in ion bombardment treatment desirably include at least Cr. Since Cr is a sublimable element, production of molten particles is less during the ion bombardment treatment and the surface of substrate 201 can be prevented from roughening.

In the present embodiment, before the adhering step (S220), the step of removing at least a part of the binder phase exposed at the surface of substrate 201 (S210) through ion bombardment treatment using Ar ions can also be performed. An occupancy by the WC particles at the surface can thus further be enhanced. Then, by adhering one or more elements selected from Cr, Ti, Zr, and Nb to the surface of substrate 201, these elements and the WC particles tend to firmly be bound to each other and a function of adhesion by adhesive layer 211 is further improved.

<Step of Forming Adhesive Layer (S230)>

In the present embodiment, one or more elements selected from Cr, Ti, Zr, and Nb adhere to the surface of substrate 201, and thereafter adhesive layer 211 is formed on the surface. Adhesive layer 211 is formed, for example, by depositing an element to form the upper layer with cathode arc ion plating on the surface to which one or more elements selected from Cr, Ti, Zr, and Nb have adhered. Thus, a carbide, a nitride, or a carbonitride containing one or more elements selected from Cr, Ti, Zr, and Nb, one or more elements selected from the elements forming substrate 201, and one or more elements selected from the elements forming upper layer 212 can be generated on substrate 201.

<Step of Forming Upper Layer (S240)>

Then, successively, upper layer 212 can be formed by depositing the elements forming upper layers 212 on adhesive layer 211 with cathode arc ion plating.

After upper layer 212 is formed, compressive residual stress may be provided to coating film 210 for improving toughness of coating film 210. Compressive residual stress can be provided, for example, with blasting, brushing, barreling, and ion implantation.

The surface-coated tool in the present embodiment can readily be manufactured through the steps above.

EXAMPLES

Though the present embodiment will be described hereinafter in further detail with reference to Examples, the present embodiment is not limited thereto.

First Example

A first example corresponds to the first embodiment.

<Manufacturing of Samples Nos. 1-1 to 1-8 and Samples Nos. 1-11 to 1-14>

Surface-coated tools (samples Nos. 1-1 to 1-8 and samples Nos. 1-11 to 1-14) were manufactured as below, and a cutting test was conducted to evaluate life of the tool. Here, samples Nos. 1-1 to 1-8 correspond to Examples and samples Nos. 1-11 to 1-14 correspond to Comparative Examples.

<Step of Preparing Substrate>

Initially, a substrate made of cemented carbide, of which material was "ISO P30 grade" and shape was "SFKN12T3AZTN", was prepared as substrate 101. This substrate made of cemented carbide contains hard particles containing WC and a binder phase containing Co and binding the hard particles to one another. In this substrate made of cemented carbide, the WC particles have a particle size of 2 µm and a content of Co is 10 mass %.

<Step of Forming Coating Film>

Figure 3:
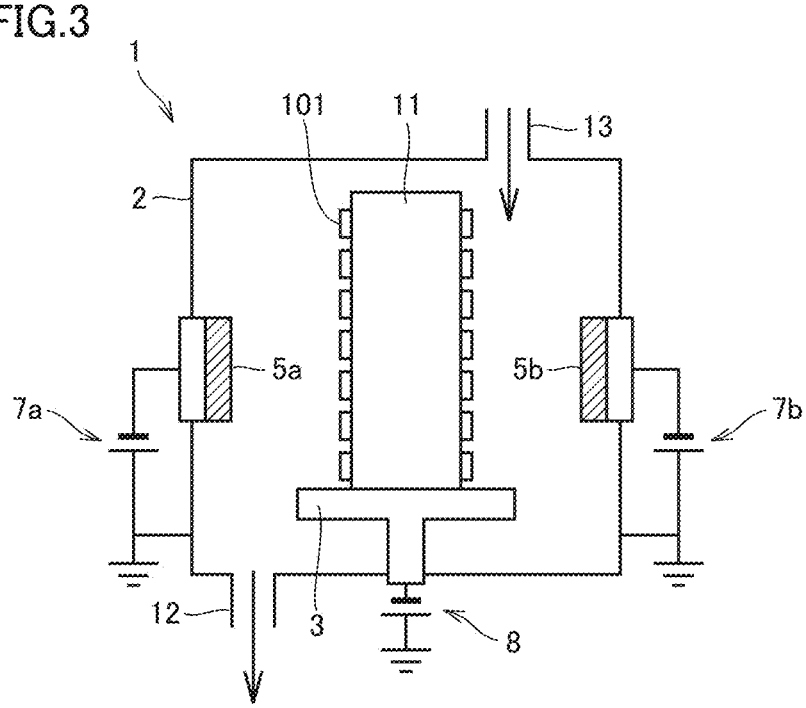
FIG. 3 is a schematic side perspective view showing one example of a construction of a film formation apparatus according to a first example of the present invention.
Figure 4:
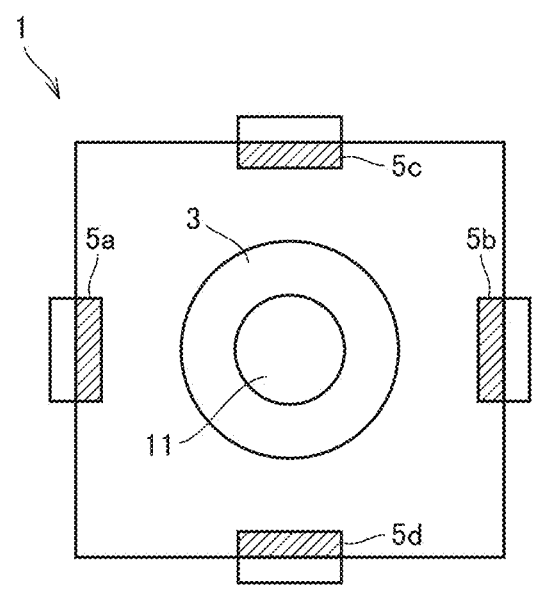
FIG. 4 is a schematic plan perspective view showing one example of the construction of the film formation apparatus according to the first example of the present invention.

FIG. 3 is a schematic side perspective view of a film formation apparatus (a cathode arc ion plating apparatus) used in forming a coating film, and FIG. 4 is a schematic plan perspective view (from above) of the apparatus. Referring to FIG. 3, a film formation apparatus 1 includes a chamber 2, a gas introduction port 13 for introducing a source gas into chamber 2, and a gas emission port 12 for emitting the source gas to the outside. Chamber 2 is connected to a vacuum pump (not shown) and constructed to be able to regulate a pressure in chamber 2 through gas emission port 12.

A turntable 3 is provided in chamber 2, and a substrate holder 11 for holding substrate 101 is attached to turntable 3. Substrate holder 11 is electrically connected to a negative electrode of a bias power supply 8. A positive electrode of bias power supply 8 is grounded and electrically connected to chamber 2. Referring to FIG. 4, a target (arc evaporation sources 5a, 5b, 5c, and 5d) to serve as a metal source material for a coating film is attached to a sidewall of chamber 2. Referring again to FIG. 3, the arc evaporation sources are connected to respective negative electrodes of DC power supplies 7a and 7b which are variable power supplies. Respective positive electrodes of DC power supplies 7a and 7b are grounded.

<Samples Nos. 1-1 to 1-4 and 1-14>

Initially, substrate 101 was installed on substrate holder 11 in film formation apparatus 1. Then, a pressure in chamber 2 was reduced to $1.0 \times 10^{-4}$ Pa with the vacuum pump. Furthermore, while turntable 3 was turned, substrate 101 was heated to 500° C. with a heater (not shown) installed in film formation apparatus 1.

An Ar (argon) gas was introduced through gas introduction port 13, a voltage of bias power supply 8 was gradually increased to −1000 V while the pressure in chamber 2 was held at 3.0 Pa, and the surface of substrate 101 was cleaned through ion bombardment treatment using Ar ions.

Then, alternate layer 112 was formed. The arc evaporation source (a sintered alloy target) for providing an alternate layer having the composition shown in Table 1 was set, a nitrogen gas was introduced as a reaction gas into chamber 2, and a film was formed while turntable 3 was turned and various conditions were varied within a range as follows.

A composition of each layer shown in Table 1 was confirmed by conducting TEM-EDX analysis after film formation. "Continuous" in a field of "change in a" or "change in d" in Table 1 refers to continuous increase or decrease in composition ratio "a" or "d" of Ti in each layer in the direction of thickness of the coating film, and "stepwise" refers to stepwise increase or decrease in composition ratio in the direction of thickness of the coating film.

A thickness of each of A layer 112a and B layer 112b and the number of stacked layers in alternate layer 112 were adjusted based on a speed of rotation of substrate 101, and supply of a current to a cathode was stopped at the time point when a thickness of alternate layer 112 attained to a value shown in Table 1.

<Condition for Forming Alternate Layer>

Temperature of substrate: 500° C. (constant)

Reaction gas pressure: 0.5 to 10 Pa (constant or continuously varied)

Bias voltage: −30 V to −800 V (constant or continuously varied)

Arc current 100 A (constant)

"Constant or continuously varied" here means being maintained at a certain constant value within a range, for example, from "0.5 to 10 Pa" or continuous increase or decrease within the range from "0.5 to 10 Pa."

It can be seen in Table 1 that the surface-coated tools (samples Nos. 1-1 to 1-8) including a substrate and a coating film formed on the substrate, the coating film including an alternate layer in which one or more A layers and one or

TABLE 1

| | Coating film | | | | | | | | | Evaluation |
|---|---|---|---|---|---|---|---|---|---|---|
| | Alternate Layer | | | | | | | | | Distance |
| | A Layer | | | B Layer | | | | | Adhesive Layer | of |
| No. | Average Composition $Ti_aAl_bSi_cN$ | Thickness $\lambda_A$ [nm] | Change in a | Average Composition $Ti_dAl_eSi_fN$ | Thickness $\lambda_B$ [nm] | Change in d | $\lambda_A/\lambda_B$ [—] | Thickness [μm] | Average Composition | Thickness [nm] | Cutting [mm] |
| 1-1 | $Ti_{0.7}Al_{0.25}Si_{0.05}N$ | 100 | Continuous | $Ti_{0.5}Al_{0.45}Si_{0.05}N$ | 50 | Continuous | 2.00 | 3.6 | — | — | 1000 |
| 1-2 | $Ti_{0.7}Al_{0.25}Si_{0.05}N$ | 50 | Continuous | $Ti_{0.5}Al_{0.45}Si_{0.05}N$ | 80 | Stepwise | 0.63 | 3.7 | — | — | 1000 |
| 1-3 | $Ti_{0.7}Al_{0.25}Si_{0.05}N$ | 20 | Stepwise | $Ti_{0.5}Al_{0.45}Si_{0.05}N$ | 30 | Continuous | 0.67 | 3.7 | — | — | 1000 |
| 1-4 | $Ti_{0.7}Al_{0.25}Si_{0.05}N$ | 20 | Stepwise | $Ti_{0.5}Al_{0.45}Si_{0.05}N$ | 10 | Stepwise | 2.00 | 3.6 | — | — | 1000 |
| 1-5 | $Ti_{0.7}Al_{0.25}Si_{0.05}N$ | 10 | Continuous | $Ti_{0.5}Al_{0.45}Si_{0.05}N$ | 10 | Continuous | 1.00 | 3.6 | $W_{0.4}Cr_{0.2}Ti_{0.20}Al_{0.15}Si_{0.05}N$ | 5 | 1200 |
| 1-6 | $Ti_{0.7}Al_{0.25}Si_{0.05}N$ | 5 | Stepwise | $Ti_{0.5}Al_{0.45}Si_{0.05}N$ | 5 | Stepwise | 1.00 | 3.6 | $W_{0.4}Cr_{0.2}Ti_{0.20}Al_{0.15}Si_{0.05}N$ | 5 | 1200 |
| 1-7 | $Ti_{0.65}Al_{0.3}Si_{0.05}N$ | 10 | Continuous | $Ti_{0.55}Al_{0.4}Si_{0.05}N$ | 10 | Continuous | 1.00 | 3.6 | $W_{0.4}Cr_{0.2}Ti_{0.2}Al_{0.15}Si_{0.05}N$ | 5 | 1800 |
| 1-8 | $Ti_{0.65}Al_{0.3}Si_{0.05}N$ | 5 | Stepwise | $Ti_{0.55}Al_{0.4}Si_{0.05}N$ | 5 | Stepwise | 1.00 | 3.6 | $W_{0.4}Cr_{0.2}Ti_{0.2}Al_{0.15}Si_{0.05}N$ | 5 | 1800 |
| 1-11 | TiN | — | — | — | — | — | — | 3.7 | — | — | 300 |
| 1-12 | $Ti_{0.5}Al_{0.5}N$ | — | None | — | — | — | — | 3.5 | — | — | 400 |
| 1-13 | $Ti_{0.48}Al_{0.47}Si_{0.05}N$ | — | None | — | — | — | — | 3.5 | — | — | 600 |
| 1-14 | $Ti_{0.85}Al_{0.1}Si_{0.05}N$ | 50 | None | $Ti_{0.35}Al_{0.6}Si_{0.05}N$ | 50 | None | 1.00 | 3.5 | — | — | 600 |

<Samples Nos. 1-5 to 1-8>

As shown in Table 1, in samples Nos. 1-5 to 1-8, the adhesive layer was formed in addition to the alternate layer. Namely, as above, the surface of substrate 101 was cleaned through the ion bombardment treatment using Ar ions, and thereafter ion bombardment treatment using Cr ions was further performed to adhere the Cr ions to the surface of substrate 101. Then, the alternate layer shown in Table 1 was formed. As a result of TEM-EDX analysis following film formation, the adhesive layer having the composition shown in Table 1 was formed at the interface between the alternate layer and the substrate.

<Samples Nos. 1-11 to 1-13>

As shown in Table 1, in samples Nos. 1-11 to 1-13, a coating film having a single composition was formed. In Table 1, the composition of the coating film in such a tool is shown in a field of the A layer for the sake of convenience.

<Evaluation of Life of Tool>

Each sample fabricated above was used and a dry intermittent cutting test was conducted to evaluate life of the tool. Cutting conditions were as follows and a distance of cutting until life of the tool was reached was measured. Table 1 shows results. In Table 1, a longer distance of cutting indicates longer life of the tool.

<Condition for Cutting>

Work material: stainless steel (SUS 316)
Cutting speed: 200 m/min.
Feed rate: 0.2 mm/blade
Amount of cutting ap: 2.0 mm
Amount of cutting ae: 50 mm Here, "amount of cutting ap" refers to an amount of cutting in an axial direction and "amount of cutting ae" refers to an amount of cutting in a direction of radius.

more B layers are alternately stacked, the A layer and the B layer each having a thickness not smaller than 2 nm and not greater than 100 nm, an average composition of the A layer being expressed as $Ti_aAl_bSi_cN$ (0.5<a<0.8, 0.2<b<0.4, 0.01<c<0.1, a+b+c=1), an average composition of the B layer being expressed as $Ti_dAl_eSi_fN$ (0.4<d<0.6, 0.3<e<0.7, 0.01<f<0.1, d+e+f=1), and a condition of 0.05<a−d≤0.2 and 0.05<e−b≤0.2 being satisfied exhibit stable longer life than the surface-coated tools (samples Nos. 1-11 to 1-14) failing to satisfy the conditions.

The reason why such a result was obtained may be because adhesiveness between layers is high because the A layer and the B layer are formed of the same elements in samples Nos. 1-1 to 1-8 and propagation of a crack can be suppressed between the A layer and the B layer owing to a difference in composition ratio between the A layer and the B layer.

It can further be seen in Table 1 that samples Nos. 1-5 to 1-8 in which the adhesive layer containing the element (W) forming the substrate, the elements (Ti, Al, Si, and N) forming the alternate layer, and Cr is formed are longer in life of the tool than samples Nos. 1-1 to 1-4 not including the adhesive layer. This may be because peel-off of the coating film itself is prevented owing to the presence of the adhesive layer and life of the tool extends.

Second Example

<Manufacturing of Samples Nos. 2-1 to 2-25 and Samples Nos. 2-101 to 2-105>

Surface-coated tools (samples Nos. 2-1 to 2-25 and samples Nos. 2-101 to 2-105) were manufactured as below, and a cutting test was conducted to evaluate life of the tool. Here, samples Nos. 2-1 to 2-23 correspond to Examples and samples Nos. 2-24 and 2-25 and Nos. 2-101 to 2-105 correspond to Comparative Examples.

<Step of Preparing Substrate (S100)>

Initially, a substrate made of cemented carbide, of which material was "ISO P30 grade" and shape was "SFKN12T3AZTN", was prepared as substrate 201. This substrate made of cemented carbide contains WC particles and a binder phase containing Co and binding the WC particles to one another. Table 2 shows a particle size of the WC particles and a content of the binder phase in each sample.

supply 28. A positive electrode of bias power supply 28 is grounded and electrically connected to chamber 22.

Chamber 22 is provided with a gas introduction port 33 for introducing a source gas and a gas emission port 32. A pressure in chamber 22 can be regulated by suctioning a gas with a vacuum pump (not shown) through gas emission port 32.

Initially, substrate 201 was installed on substrate holder 31 in film formation apparatus 21. Then, a pressure in chamber 22 was reduced to $1.0 \times 10^{-4}$ Pa with the vacuum pump. Furthermore, while substrate holder 31 was turned, substrate 201 was heated to 500° C. with a heater (not shown) installed in film formation apparatus 21.

TABLE 2

| | Coating film | | | | Substrate | |
|---|---|---|---|---|---|---|
| | Upper Layer | | Adhesive Layer | | WC Particles | Binder Phase |
| No. | Composition | Thickness [μm] | Composition | Thickness [μm] | Particle Size [μm] | (Co) [wt %] |
| 2-1 | $Ti_{0.5}Al_{0.5}N$ | 3.7 | $Ti_{0.2}Al_{0.2}Cr_{0.2}W_{0.4}CN$ | 3 | 3.0 | 11.0 |
| 2-2 | $Ti_{0.5}Al_{0.5}N$ | 3.7 | $Ti_{0.4}W_{0.6}CN$ | 3 | 3.0 | 11.0 |
| 2-3 | $Ti_{0.5}Al_{0.5}N$ | 3.7 | $Cr_{0.4}W_{0.6}CN$ | 3 | 3.0 | 11.0 |
| 2-4 | $Ti_{0.5}Al_{0.5}N$ | 3.7 | $Ti_{0.25}Al_{0.25}W_{0.5}CN$ | 3 | 3.0 | 11.0 |
| 2-5 | $Ti_{0.5}Al_{0.5}N$ | 3.7 | $Ti_{0.25}Cr_{0.2}Si_{0.05}W_{0.5}CN$ | 3 | 3.0 | 11.0 |
| 2-6 | $Ti_{0.5}Al_{0.5}N$ | 3.7 | $Ti_{0.25}Al_{0.20}Si_{0.05}W_{0.5}CN$ | 3 | 3.0 | 11.0 |
| 2-7 | $Ti_{0.5}Al_{0.5}N$ | 3.7 | $Ti_{0.2}Al_{0.15}Si_{0.05}Cr_{0.2}W_{0.4}CN$ | 4 | 3.0 | 11.0 |
| 2-8 | $Ti_{0.5}Al_{0.5}N$ | 3.7 | $Ti_{0.2}Al_{0.2}Cr_{0.2}W_{0.4}CN$ | 3 | 3.0 | 10.5 |
| 2-9 | $Ti_{0.5}Al_{0.5}N$ | 3.7 | $Ti_{0.2}Al_{0.2}Cr_{0.2}W_{0.4}CN$ | 4 | 3.0 | 10.5 |
| 2-10 | $Ti_{0.5}Al_{0.5}N$ | 3.6 | $Ti_{0.2}Al_{0.2}Cr_{0.2}W_{0.4}CN$ | 3 | 3.0 | 10.5 |
| 2-11 | $Ti_{0.5}Al_{0.5}N$ | 3.6 | $Ti_{0.2}Al_{0.2}Cr_{0.2}W_{0.4}CN$ | 4 | 2.0 | 10.0 |
| 2-12 | $Ti_{0.5}Al_{0.5}N$ | 3.7 | $Ti_{0.2}Al_{0.2}Cr_{0.2}W_{0.4}CN$ | 4 | 3.0 | 10.5 |
| 2-13 | $Ti_{0.5}Al_{0.5}N$ | 3.7 | $Ti_{0.2}Al_{0.2}Cr_{0.2}W_{0.4}CN$ | 4 | 3.0 | 10.5 |
| 2-14 | $Ti_{0.5}Al_{0.5}N$ | 3.7 | $Ti_{0.2}Al_{0.2}Cr_{0.2}W_{0.4}CN$ | 4 | 2.0 | 10.0 |
| 2-15 | $Ti_{0.5}Al_{0.5}N$ | 3.6 | $Ti_{0.2}Al_{0.2}Cr_{0.2}W_{0.4}CN$ | 3 | 1.5 | 10.5 |
| 2-16 | $Ti_{0.5}Al_{0.5}N$ | 3.6 | $Ti_{0.2}Al_{0.2}Cr_{0.2}W_{0.4}CN$ | 3 | 1.5 | 9.0 |
| 2-17 | $Ti_{0.5}Al_{0.5}N$ | 3.6 | $Ti_{0.2}Al_{0.2}Cr_{0.2}W_{0.4}CN$ | 4 | 1.5 | 9.0 |
| 2-18 | $Ti_{0.5}Al_{0.5}N$ | 3.6 | $Ti_{0.2}Al_{0.2}Cr_{0.2}W_{0.4}CN$ | 4 | 3.0 | 10.5 |
| 2-19 | $Ti_{0.5}Al_{0.5}N$ | 3.7 | $Ti_{0.2}Al_{0.2}Cr_{0.2}W_{0.4}CN$ | 5 | 2.0 | 10.0 |
| 2-20 | $Ti_{0.5}Al_{0.5}N$ | 3.7 | $Ti_{0.2}Al_{0.2}Cr_{0.2}W_{0.4}CN$ | 3 | 1.5 | 9.0 |
| 2-21 | $Ti_{0.5}Al_{0.5}N$ | 3.7 | $Ti_{0.2}Al_{0.2}Cr_{0.2}W_{0.4}CN$ | 4 | 1.5 | 9.0 |
| 2-22 | $Ti_{0.9}Si_{0.1}N$ | 3.7 | $Ti_{0.2}Al_{0.2}Cr_{0.2}W_{0.4}CN$ | 3 | 1.5 | 9.0 |
| 2-23 | $Ti_{0.50}Al_{0.45}Si_{0.05}N$ | 3.7 | $Ti_{0.2}Al_{0.15}Si_{0.05}Cr_{0.2}W_{0.4}CN$ | 3 | 1.5 | 9.0 |
| 2-24 | $Ti_{0.5}Al_{0.5}N$ | 3.7 | $Ti_{0.2}Al_{0.2}Cr_{0.2}W_{0.4}CN$ | 0.3 | 1.0 | 9.0 |
| 2-25 | $Ti_{0.5}Al_{0.5}N$ | 3.6 | $Ti_{0.2}Al_{0.2}Cr_{0.2}W_{0.4}CN$ | 25 | 1.0 | 10.0 |
| 2-101 | TiN | 3.9 | — | — | 3.0 | 10.5 |
| 2-102 | TiN | 3.8 | TiN | 100 | 3.0 | 10.5 |
| 2-103 | $Ti_{0.5}Al_{0.5}N$ | 3.6 | — | — | 3.0 | 10.5 |
| 2-104 | $Ti_{0.9}Si_{0.1}N$ | 3.7 | — | — | 3.0 | 10.5 |
| 2-105 | $Ti_{0.50}Al_{0.45}Si_{0.05}N$ | 3.8 | — | — | 3.0 | 10.5 |

<Step of Forming Coating Film (S200)>

Figure 8:
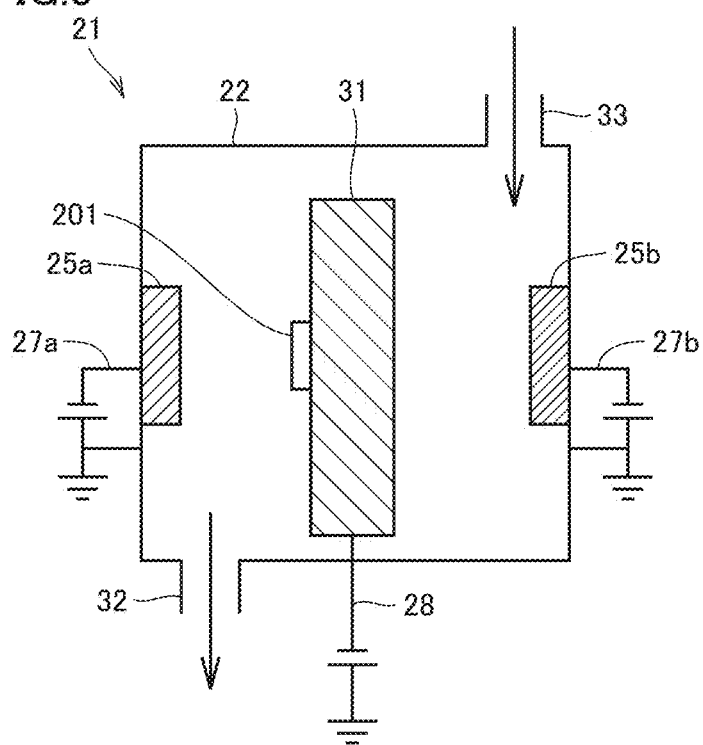
FIG. 8 is a schematic side perspective view showing one example of a construction of a film formation apparatus according to a second example of the present invention.
Figure 9:
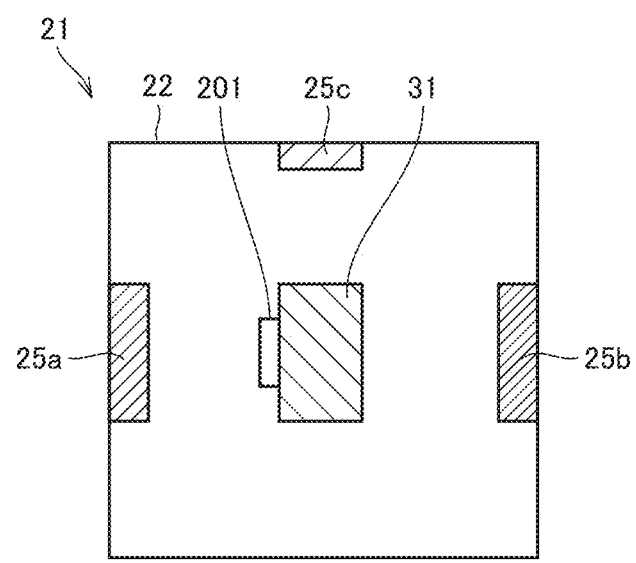
FIG. 9 is a schematic plan perspective view showing one example of the construction of the film formation apparatus according to the second example of the present invention.

FIG. 8 is a schematic side perspective view of a film formation apparatus (cathode arc ion plating apparatus) used in forming a coating film, and FIG. 9 is a schematic plan perspective view (from above) of the apparatus.

Referring to FIG. 9, in a film formation apparatus 21, a target (an arc evaporation source 25a, an arc evaporation source 25b, and an arc evaporation source 25c) to serve as a metal source material for a coating film and a rotary substrate holder 31 for installing substrate 201 are attached in a chamber 22. Referring to FIG. 8, a DC power supply 27a is attached to arc evaporation source 25a, a DC power supply 27b is attached to arc evaporation source 25b, and a bias power supply 28 is attached to substrate holder 31. DC power supply 27a and DC power supply 27b are variable power supplies and arc evaporation source 25a and arc evaporation source 25b are connected to respective negative electrodes of the DC power supplies. Substrate holder 31 is electrically connected to a negative electrode of bias power <Removing Step (S210)>

An Ar gas was introduced through gas introduction port 33, a voltage of bias power supply 28 was gradually increased to −1000 V while the pressure in chamber 22 was held at 3.0 Pa, and the surface of substrate 201 was cleaned for 15 minutes through ion bombardment treatment using Ar ions. The binder phase exposed at the surface of substrate 201 was thus removed.

<Adhering Step (S220)>

The surface of substrate 201 was further cleaned and elements shown in Table 3 adhered to the surface by applying an arc current of 100 A to arc evaporation source 25c (the metal target shown in Table 3) to thereby subject the surface of substrate 201 to ion bombardment treatment. Here, a time period for treatment was set to the time period shown in Table 3. As shown in Table 3, such treatment was not performed for samples Nos. 2-101 and 2-103 to 2-105.

TABLE 3

| No. | Removing Step Ar Bombardment Treatment Treatment Time Period [min] | Adhering Step Ion Bombardment Treatment Metal Target | Adhering Step Ion Bombardment Treatment Treatment Time Period [min] |
|---|---|---|---|
| 2-1 | 15 | Cr | 30 |
| 2-2 | 15 | Ti | 30 |
| 2-3 | 15 | Cr | 30 |
| 2-4 | 15 | Ti | 30 |
| 2-5 | 15 | Cr | 30 |
| 2-6 | 15 | Ti | 30 |
| 2-7 | 15 | Cr | 30 |
| 2-8 | 15 | Cr | 60 |
| 2-9 | 15 | Cr | 30 |
| 2-10 | 15 | Cr | 30 |
| 2-11 | 15 | Cr | 30 |
| 2-12 | 15 | Cr | 90 |
| 2-13 | 15 | Cr | 90 |
| 2-14 | 15 | Cr | 90 |
| 2-15 | 15 | Cr | 90 |
| 2-16 | 15 | Cr | 90 |
| 2-17 | 15 | Cr | 90 |
| 2-18 | 15 | Cr | 30 |
| 2-19 | 15 | Cr | 30 |
| 2-20 | 15 | Cr | 30 |
| 2-21 | 15 | Cr | 30 |
| 2-22 | 15 | Cr | 30 |
| 2-23 | 15 | Cr | 30 |
| 2-24 | 15 | Cr | 30 |
| 2-25 | 15 | Cr | 30 |
| 2-101 | 15 | Not Performed | |
| 2-102 | 15 | Ti | 30 |
| 2-103 | 15 | Not Performed | |
| 2-104 | 15 | Not Performed | |
| 2-105 | 15 | Not Performed | |

<Steps of Forming Adhesive Layer and Upper Layer (S230 and S240)>

Then, adhesive layer 211 was formed. Respective sintered alloy targets providing adhesive layer 211 and upper layer 212 having the compositions shown in Table 2 were set as arc evaporation source 25a and arc evaporation source 25b, a nitrogen gas and a methane gas were introduced as reaction gases into chamber 22, a film was formed under conditions as follows while substrate holder 31 was turned, and supply of a current to a cathode was stopped at the time point when a thickness of upper layer 212 attained to a value shown in Table 2. Here, a composition of each layer shown in Table 2 was confirmed by cutting a sample after film formation and conducting TEM-EDX analysis at a cut surface. In Table 2, for the samples (Nos. 2-101 and 2-103 to 2-105) not including the adhesive layer, a composition and a thickness of the entire coating film are shown in a field of the upper layer for the sake of convenience.

<Condition for Film Formation>
Temperature of substrate: 500° C. (constant)
Reaction gas pressure: 2.0 Pa (constant)
Bias voltage: −30 V to −800 V (constant or continuously varied)
Arc current: 100 A (constant)
"Constant or continuously varied" here means being maintained at a certain constant value within a range, for example, from "−30 V to −800 V" or continuous increase or decrease within the range from "−30 V to −800 V."

<Evaluation of Coating Film>
A thickness of adhesive layer 211 was found by cutting each sample and observing a cut surface with a TEM. Table 2 shows results. Whether or not crystal lattices were continuous at the interface between substrate 201 and adhesive layer 211 and at the interface between adhesive layer 211 and upper layer 212 was further checked with the TEM. Table 4 shows results. "Continuous" in a field of "continuity of crystal lattices" in Table 4 refers to crystal lattices being continuous at both of the interface between substrate 201 and adhesive layer 211 and the interface between adhesive layer 211 and upper layer 212 and "discontinuous" refers to crystal lattices not being continuous at at least one interface.

TEM-EDX analysis of the cut surface was conducted to check a composition of adhesive layer 211 and whether or not respective composition ratios of C and N were continuously varied in the direction of thickness of the adhesive layer. Table 4 shows results. "Yes" in a field of "change in C, N in direction of thickness" in Table 4 refers to the fact that a composition ratio of C contained in adhesive layer 211 continuously increased from the side of upper layer 212 toward substrate 201 and attained to the maximum at the interface with substrate 201 and a composition ratio of N contained in adhesive layer 211 continuously increased from the side of substrate 201 toward upper layer 212 and attained to the maximum at the interface with upper layer 212, and "no" refers to no such change in composition ratio.

A reference line having a length of 3 μm was set in the cut surface in accordance with the method described previously, and an occupancy by the WC particles in the portion of substrate 201 in contact with adhesive layer 211 was found. Table 4 shows results.

TABLE 4

| No. | Adhesive Layer Continuity of Crystal Lattices | Adhesive Layer Change in Amount of C, N in Direction of Thickness | Substrate Occupancy by WC Particles in Portion in Contact with Adhesive Layer [%] |
|---|---|---|---|
| 2-1 | Discontinuous | No | 50 |
| 2-2 | Discontinuous | No | 50 |
| 2-3 | Discontinuous | No | 50 |
| 2-4 | Discontinuous | No | 50 |
| 2-5 | Discontinuous | No | 50 |
| 2-6 | Discontinuous | No | 50 |
| 2-7 | Discontinuous | No | 50 |
| 2-8 | Discontinuous | No | 80 |
| 2-9 | Continuous | No | 50 |
| 2-10 | Discontinuous | Yes | 50 |
| 2-11 | Discontinuous | No | 50 |
| 2-12 | Continuous | No | 90 |
| 2-13 | Discontinuous | Yes | 90 |
| 2-14 | Discontinuous | No | 90 |
| 2-15 | Continuous | Yes | 50 |
| 2-16 | Continuous | No | 50 |
| 2-17 | Discontinuous | Yes | 50 |
| 2-18 | Continuous | Yes | 80 |
| 2-19 | Continuous | No | 80 |
| 2-20 | Discontinuous | Yes | 90 |
| 2-21 | Continuous | Yes | 90 |
| 2-22 | Continuous | Yes | 90 |
| 2-23 | Continuous | Yes | 90 |
| 2-24 | Continuous | Yes | 90 |
| 2-25 | Continuous | Yes | 90 |
| 2-101 | — | — | 50 |
| 2-102 | — | No | 50 |
| 2-103 | — | — | 50 |
| 2-104 | — | — | 50 |
| 2-105 | — | — | 50 |

<Evaluation of Life of Tool>
Each sample fabricated above was used and a dry intermittent cutting test was conducted to evaluate life of the tool. Cutting conditions were as follows and a distance of cutting until life of the tool was reached was measured. Table 5 shows results. In Table 5, a longer distance of cutting indicates longer life of the tool.

<Condition for Cutting>
Work material: stainless steel (SUS 316)
Cutting speed: 200 m/min.
Feed rate: 0.2 mm/blade
Amount of cutting ap: 2.0 mm
Amount of cutting ae: 50 mm Here, "amount of cutting ap" refers to an amount of cutting in an axial direction and "amount of cutting ae" refers to an amount of cutting in a direction of radius.

TABLE 5

| No. | Tool Life Distance of Cutting [mm] |
|---|---|
| 2-1 | 700 |
| 2-2 | 700 |
| 2-3 | 700 |
| 2-4 | 700 |
| 2-5 | 700 |
| 2-6 | 700 |
| 2-7 | 700 |
| 2-8 | 900 |
| 2-9 | 800 |
| 2-10 | 800 |
| 2-11 | 800 |
| 2-12 | 1100 |
| 2-13 | 1000 |
| 2-14 | 1000 |
| 2-15 | 1000 |
| 2-16 | 1000 |
| 2-17 | 1000 |
| 2-18 | 1300 |
| 2-19 | 1200 |
| 2-20 | 1200 |
| 2-21 | 1500 |
| 2-22 | 1700 |
| 2-23 | 1800 |
| 2-24 | 500 |
| 2-25 | 600 |
| 2-101 | 200 |
| 2-102 | 300 |
| 2-103 | 300 |
| 2-104 | 300 |
| 2-105 | 300 |

It can be seen in Tables 2 and 5 that surface-coated tools (samples Nos. 2-1 to 2-23) including a substrate and a coating film formed on the substrate, the substrate containing WC particles and a binder phase containing Co and binding the WC particles to one another, the coating film including an adhesive layer in contact with the substrate and an upper layer formed on the adhesive layer, the adhesive layer having a thickness not smaller than 0.5 nm and not greater than 20 nm, and the adhesive layer containing a carbide, a nitride, or a carbonitride containing one or more elements selected from Cr, Ti, Zr, and Nb, one or more elements selected from elements forming the substrate, and one or more elements selected from elements forming the upper layer exhibit stable longer life than surface-coated tools (samples Nos. 2-24 and 2-25 and Nos. 2-101 to 2-105) failing to satisfy the conditions.

The reason why such a result was obtained may be because adhesiveness between the coating film and the substrate is improved and peel-off of the coating film is suppressed owing to the presence of the adhesive layer having the specific composition above.

It could be demonstrated through Examples above that a surface-coated tool obtained with the manufacturing method including the steps of preparing a substrate containing WC particles and a binder phase containing Co and binding the WC particles to one another and forming a coating film on the substrate, the step of forming a coating film including the steps of adhering one or more elements selected from Cr, Ti, Zr, and Nb onto a surface of the substrate, forming an adhesive layer on the substrate, and forming an upper layer on the adhesive layer, the adhesive layer having a thickness not smaller than 0.5 nm and not greater than 20 nm, and the step of forming an adhesive layer including the step of generating, by depositing one or more elements selected from elements forming the upper layer on the surface subjected to the adhering step, a carbide, a nitride, or a carbonitride containing one or more elements selected from Cr, Ti, Zr, and Nb, one or more elements selected from elements forming the substrate, and the one or more elements selected from the elements forming the upper layer is a tool which is excellent in adhesiveness between the substrate and the coating film and can withstand even a severe cutting condition.

It should be understood that the embodiments disclosed herein are illustrative and non-restrictive in every respect. The scope of the present invention is defined by the terms of the claims, rather than the embodiments described above, and is intended to include any modifications within the scope and meaning equivalent to the terms of the claims.

REFERENCE SIGNS LIST 1, 21 film formation apparatus; 2, 22 chamber; 3 turntable; 5a, 5b, 5c, 5d, 25a, 25b, 25c arc evaporation source; 7a, 7b, 27a, 27b DC power supply; 8, 28 bias power supply; 11, 31 substrate holder; 12, 32 gas emission port; 13, 33 gas introduction port; 100, 200 surface-coated tool; 101, 201 substrate; 110, 210 coating film; 111, 211 adhesive layer; 112 alternate layer; 112a A layer; 112b B layer; and 212 upper layer.

The invention claimed is:

1. A surface-coated tool, comprising:
   a substrate; and
   a coating film formed on said substrate,
   said coating film including an alternate layer in which one or more A layers and one or more B layers are alternately stacked,
   said A layer and said B layer each having a thickness not smaller than 2 nm and not greater than 100 nm,
   an average composition of said A layer being expressed as $Ti_aAl_bSi_cN$ ($0.5<a<0.8$, $0.2<b<0.4$, $0.01<c<0.1$, $a+b+c=1$),
   an average composition of said B layer being expressed as $Ti_dAl_eSi_fN$ ($0.4<d<0.6$, $0.3<e<0.7$, $0.01<f<0.1$, $d+e+f=1$), and
   a condition of $0.05<a-d\leq0.2$ and $0.05<e-b\leq0.2$ being satisfied.

2. The surface-coated tool according to claim 1, wherein a condition of $1\leq\lambda_A/\lambda_B<5$ is satisfied,
   where $\lambda_A$ represents the thickness of said A layer and $\lambda_B$ represents the thickness of said B layer.

3. The surface-coated tool according to claim 1, wherein said coating film further includes an adhesive layer in a portion in contact with said substrate,
   said adhesive layer has a thickness not smaller than 0.5 nm and not greater than 20 nm, and
   said adhesive layer contains a carbide, a nitride, or a carbonitride containing one or more elements selected from Cr, Ti, Zr, and Nb, one or more elements selected from elements forming said substrate, and one or more elements selected from Al and Si.

4. The surface-coated tool according to claim 3, wherein
said substrate contains hard particles containing WC and a binder phase containing Co and binding said hard particles to one another, and
said adhesive layer contains a nitride containing W, Cr, Ti, Al, and Si.

5. A surface-coated tool, comprising:
a substrate; and
a coating film formed on said substrate,
said substrate containing WC particles and a binder phase containing Co and binding said WC particles to one another,
said coating film including an adhesive layer in contact with said substrate and an upper layer formed on said adhesive layer,
said adhesive layer having a thickness not smaller than 0.5 nm and not greater than 20 nm,
said adhesive layer containing a carbide, a nitride, or a carbonitride containing one or more elements selected from Cr, Ti, Zr, and Nb, one or more elements selected from elements forming said substrate, and one or more elements selected from elements forming said upper layer, and
said adhesive layer containing at least W.

6. The surface-coated tool according to claim 5, wherein
said upper layer contains one or more elements selected from group IV elements, group V elements, and group VI elements in periodic table, and Si and Al and one or more elements selected from C, N, and O.

7. The surface-coated tool according to claim 5, wherein
said adhesive layer contains a carbonitride containing one or more elements selected from Cr, Ti, Zr, and Nb, W, and one or more elements selected from Al and Si.

8. The surface-coated tool according to claim 5, wherein
an occupancy by said WC particles in a portion of said substrate in contact with said adhesive layer is not lower than 80%.

9. The surface-coated tool according to claim 5, wherein
in a direction of thickness of said coating film,
a composition ratio of C contained in said adhesive layer continuously increases from a side of said upper layer toward said substrate and attains to maximum at an interface with said substrate, and
a composition ratio of N contained in said adhesive layer continuously increases from a side of said substrate toward said upper layer and attains to maximum at an interface with said upper layer.

10. The surface-coated tool according to claim 5, wherein
said WC particles have an average particle size not greater than 2 μm, and
a content of Co in said substrate is not higher than 10 mass %.

11. A method of manufacturing a surface-coated tool, comprising the steps of:
preparing a substrate containing WC particles and a binder phase containing Co and binding said WC particles to one another; and
forming a coating film on said substrate,
said step of forming a coating film including the steps of adhering one or more elements selected from Cr, Ti, Zr, and Nb onto a surface of said substrate,
forming an adhesive layer on said substrate, and
forming an upper layer on said adhesive layer,
said adhesive layer having a thickness not smaller than 0.5 nm and not greater than 20 nm,
said step of forming an adhesive layer including the step of generating, by depositing one or more elements selected from elements forming said upper layer on said surface subjected to said adhering step, a carbide, a nitride, or a carbonitride containing one or more elements selected from Cr, Ti, Zr, and Nb, one or more elements selected from elements forming said substrate, and the one or more elements selected from the elements forming said upper layer, and
said adhesive layer being formed to contain at least W.

12. The method of manufacturing a surface-coated tool according to claim 11, wherein
said adhering step includes the step of cleaning said surface through ion bombardment treatment using ions of the one or more elements selected from Cr, Ti, Zr, and Nb.

13. The method of manufacturing a surface-coated tool according to claim 11, wherein
said step of forming a coating film further includes, before said adhering step, removing at least a part of said binder phase exposed at said surface of said substrate through ion bombardment treatment using Ar ions.

* * * * *